(12) United States Patent
Mihaila et al.

(10) Patent No.: US 11,888,037 B2
(45) Date of Patent: Jan. 30, 2024

(54) SELF-ALIGNED FIELD PLATE MESA FPM SIC SCHOTTKY BARRIER DIODE

(71) Applicant: Hitachi Energy Ltd, Zurich (CH)

(72) Inventors: Andrei Mihaila, Rieden (CH); Lars Knoll, Hägglingen (CH); Lukas Kranz, Zürich (CH)

(73) Assignee: Hitachi Energy Ltd, Zurich (CH)

( * ) Notice: Subject to any disclaimer, the term of this patent is extended or adjusted under 35 U.S.C. 154(b) by 257 days.

(21) Appl. No.: 16/978,560

(22) PCT Filed: Mar. 5, 2019

(86) PCT No.: PCT/EP2019/055376
§ 371 (c)(1),
(2) Date: Sep. 4, 2020

(87) PCT Pub. No.: WO2019/170631
PCT Pub. Date: Sep. 12, 2019

(65) Prior Publication Data
US 2021/0020753 A1 Jan. 21, 2021

(30) Foreign Application Priority Data
Mar. 6, 2018 (EP) ..................................... 18160331

(51) Int. Cl.
*H01L 29/06* (2006.01)
*H01L 29/40* (2006.01)
(Continued)

(52) U.S. Cl.
CPC ........ *H01L 29/407* (2013.01); *H01L 29/0649* (2013.01); *H01L 29/0661* (2013.01);
(Continued)

(58) Field of Classification Search
CPC combination set(s) only.
See application file for complete search history.

(56) References Cited

U.S. PATENT DOCUMENTS

| 5,612,232 A | 3/1997 | Thero et al. |
| 7,078,780 B2 | 7/2006 | Wu |

(Continued)

FOREIGN PATENT DOCUMENTS

| CN | 102074587 A | 5/2011 |
| CN | 104685632 A | 6/2015 |

(Continued)

OTHER PUBLICATIONS

Rong, H., et al., "Study of breakdown characteristics of 4H-SiC Schottky diode with improved 2-step mesa junction termination extension", 2014 16th European Conference on Power Electronics and Applications, Aug. 26-28, 2014, 10 pages.

(Continued)

*Primary Examiner* — Moin M Rahman
(74) *Attorney, Agent, or Firm* — Slater Matsil, LLP

(57) ABSTRACT

A power semiconductor device includes a wide-bandgap semiconductor layer having an active region and a termination region that laterally surrounds the active region. The wide-bandgap semiconductor layer has a first recess that is recessed from the first main side in the termination region and surrounds the active region and a second recess that is recessed from the first main side in the active region and is filled with an insulating material. A depth of the second recess is the same as a depth of the first recess. A field plate on the first main side of the wide-bandgap semiconductor layer exposes a first portion of the wide-bandgap semiconductor layer in the termination region.

15 Claims, 14 Drawing Sheets

(51) Int. Cl.
*H01L 29/16* (2006.01)
*H01L 29/20* (2006.01)
*H01L 29/66* (2006.01)
*H01L 29/861* (2006.01)
*H01L 29/872* (2006.01)

(52) U.S. Cl.
CPC ...... *H01L 29/1608* (2013.01); *H01L 29/2003* (2013.01); *H01L 29/6606* (2013.01); *H01L 29/66143* (2013.01); *H01L 29/8613* (2013.01); *H01L 29/872* (2013.01)

(56) References Cited

U.S. PATENT DOCUMENTS

| | | | |
|---|---|---|---|
| 8,368,165 B2 | 2/2013 | Richieri | |
| 9,887,282 B1* | 2/2018 | Cao | H01L 29/7787 |
| 2005/0258483 A1 | 11/2005 | Templier et al. | |
| 2006/0019435 A1* | 1/2006 | Sheppard | H01L 29/778 |
| | | | 257/E29.253 |
| 2006/0214242 A1* | 9/2006 | Carta | H01L 29/66068 |
| | | | 257/E29.313 |
| 2007/0108547 A1 | 5/2007 | Zhu et al. | |
| 2010/0059761 A1 | 3/2010 | Horii et al. | |
| 2011/0101369 A1 | 5/2011 | Zhu | |
| 2011/0198689 A1* | 8/2011 | Kim | H01L 29/7813 |
| | | | 257/E29.257 |
| 2015/0062996 A1* | 3/2015 | Liu | H10B 20/20 |
| | | | 365/96 |
| 2016/0020313 A1* | 1/2016 | Wu | H01L 29/7787 |
| | | | 257/194 |
| 2016/0111289 A1 | 4/2016 | Humbel et al. | |
| 2017/0200722 A1* | 7/2017 | Wu | H01L 21/764 |
| 2017/0338810 A1* | 11/2017 | Chen | H01L 29/205 |
| 2018/0012897 A1* | 1/2018 | Cheng | H01L 29/165 |

FOREIGN PATENT DOCUMENTS

| | | |
|---|---|---|
| EP | 2927962 A1 | 10/2015 |
| JP | 2014107499 A | 6/2014 |
| JP | 2016181581 A | 10/2016 |

OTHER PUBLICATIONS

Tarplee, Marc C., et al., "Design Rules for Field Plate Edge Termination in SiC Schottky Diodes", IEEE Transactions on Electron Devices, vol. 48, No. 12, Dec. 2001, pp. 2659-2664.

* cited by examiner

SELF-ALIGNED FIELD PLATE MESA FPM SIC SCHOTTKY BARRIER DIODE

CROSS-REFERENCE TO RELATED APPLICATIONS

This application is a national stage application of International Application No. PCT/EP2019/055376, filed on Mar. 5, 2019, which application claims priority to European Patent Application No. 18160331.7, filed on Mar. 6, 2018, which applications are hereby incorporated herein by reference.

FIELD OF THE INVENTION

The present invention relates to a wide-bandgap high power semiconductor device with effective edge termination comprising a field plate and a recess in the termination region (mesa termination structure) and to a method for manufacturing the same.

BACKGROUND OF THE INVENTION

Wide-bandgap (WBG) semiconductor materials such as silicon carbide (SiC), gallium nitride, gallium oxide, boron nitride, aluminum nitride, zinc oxide, diamond etc. allow to make semiconductor devices more powerful and energy efficient than those made from conventional semiconductor materials.

However, high power semiconductor devices based on wide-bandgap semiconductor materials require an efficient edge termination to avoid electric field crowding at the edge of the main contact resulting in breakdown of the device at a relatively low breakdown voltage VBR.

Edge termination may be provided in various ways including floating field rings, junction termination extension (JTE), field plates, mesa structures or some combination of these techniques.

Floating field rings are produced annularly around the active region of the semiconductor device. The generation of floating field rings can be easily integrated in the manufacturing process since the floating field rings can be formed simultaneously with a main junction in many power semiconductor devices. On the other hand, the design of a high performance floating field ring termination is very challenging given the high number of factors (e.g. ring spacing) affecting the most important trade-off between breakdown voltage and occupied wafer area. Junction termination extension (JTE) is based on the controlled addition of opposite charges by ion implantation into the surface of the semiconductor layer provided as the drift region. JTE techniques provide good termination efficiencies. However, ion implantation in wide-bandgap materials is more difficult than in conventional semiconductor materials. Moreover, the implantation steps require high temperature implantation facilities and an annealing oven especially designed for activation of such wide-bandgap materials, which makes the fabrication comparably costly. Also the quality of the semiconductor surface and therewith the device yield has been found to be degraded during the activation.

Bearing in mind the technologically difficult and expensive processing, besides the processing cost reduction, an implantation free design would enable fabrication of wide-bandgap material based rectifiers in conventional silicon cleanrooms.

The field plating technique provides relative simplicity in process requirements. It is based on a metal layer positioned upon a dielectric layer. The field plate modifies the surface potential at the edge of the main contact (active region). As a result the depletion zone is extended and thus the electrical field as well. The electric field crowding at the edge of the main contact is reduced and shifted towards the edge of the field plate. There however, due to the increasing electric field crowding, the risk of dielectric failure increases, thus limiting the achievable electrical breakdown voltage. In high power devices the problem of dielectric failure is more pronounced than in conventional silicon devices as the critical electric field crowding is almost one order of magnitude larger than in conventional silicon devices.

Mesa structure edge termination is another edge termination technique with rather simple process requirements. The technique consists of taking away material and therefore electric charges at the circumferential edge of the main contact by mechanically removal or etching of the semiconductor layer.

From the article "A new edge termination technique for SiC power devices" by Shuntao Hu et al., Solid State Eletronics 48 (2004) pp 1861-1688, there is known an edge termination technique based on a metal structure overlapping a dielectric filled mesa structure formed in a SiC epilayer. Compared to traditional field plate technique without mesa structure, field crowding at the metal corner can be alleviated by this configuration. Nevertheless premature breakdown occurs before an ideal breakdown voltage is achieved. This is because field crowding is caused by the difference in dielectric constant between SiC layer and the dielectric layer. To alleviate this effect, it is further proposed in this article to add another dielectric layer on top of the dielectric filled mesa with additional metal field plate extension overlapping the mesa structure. With this modification, in simulation, 80% of the ideal breakdown voltage is achieved.

From US 2011/0101369 A1 it is known a gallium nitride based semiconductor power device disposed in a semiconductor substrate. The power device comprises a termination area with a mesa shape disposed at a peripheral area of the semiconductor power device, a field plate, and a termination structure having at least a guard ring disposed in a trench filled with doped gallium-based epitaxial layer therein.

SUMMARY OF THE INVENTION

The present invention was made in view of the prior art described above, and the object of the present invention is to provide a wide-bandgap high power semiconductor device with more effective edge termination.

The object of the invention is attained by a power semiconductor device comprising a wide-bandgap semiconductor layer having a first main side and a second main side opposite to the first main side, wherein the first main side and the second main side extend in a lateral direction and wherein the wide-bandgap semiconductor layer comprises an active region and a termination region laterally surrounding the active region, wherein the wide-bandgap semiconductor layer has a first recess, which is recessed from the first main side in the termination region and which surrounds the active region; a field plate on the first main side of the wide-bandgap semiconductor layer exposing a first portion of the wide-bandgap semiconductor layer in the termination region. A sidewall of the first recess adjacent to the active region is laterally aligned with a circumferential edge of the field plate such that in an orthogonal projection onto a plane parallel to the first main side an edge of the recess defined by the upper end of the sidewall is within less than 1 μm from the circumferential edge of the field plate, exemplarily less than 0.5 µm, exemplarily less than 0.2 µm. The power semiconductor device according to the invention is characterized in that the wide-bandgap semiconductor layer has a second recess in the active region which is recessed from the first main side of the wide-bandgap semiconductor layer and filled with a filling material and a depth of the second recess is the same as a depth of the first recess.

Throughout the specification a wide-bandgap semiconductor refers to a semiconductor which has a bandgap larger than 2 eV. Moreover, a "lateral direction" refers to a direction parallel to the first main side and "laterally" means relating to a lateral direction. "Upper" means being at a higher level with respect to the second main side in a direction towards the first main side. A sidewall being adjacent to the active region means a sidewall of the first recess closest to the active area and its surface facing away from the active region. A first layer "exposing" a second layer means that the first layer is not formed in areas where the second layer is exposed with respect to the first layer. It does not exclude that one or more additional layers are formed on the second layer.

The field plate extends the depletion region of the device in lateral direction reducing the magnitude of the electrical field in the active region and shifting the location of the high field region (zone of critical field crowding) away from the periphery of the active region (below the edge of the contact electrode) towards the area below the edge of the field plate. The first recess forms a mesa-type edge termination. By aligning the sidewall of the first recess with the circumferential edge of the field plate, the mesa edge termination efficiently reduces the critical field crowding in the region below the circumferential edge of the field plate for a given voltage. Thus, a higher breakdown voltage can be achieved. As a result, an efficient edge termination is provided. The second recess may reduce leakage currents.

Further developments of the invention are specified in the dependent claims.

In an exemplary embodiment the device comprises a dielectric layer interposed between the field plate and the wide-bandgap semiconductor layer to separate the field plate from the wide-bandgap semiconductor layer. The dielectric layer amplifies the effect of the field plate and provides additional electric field relief. The dielectric layer may contain a high field region that exists between the field plate and the wide-bandgap semiconductor layer. The dielectric layer may also reduce the critical field crowding below the circumferential edge of the field plate.

In an exemplary embodiment of the device a thickness of the dielectric layer perpendicular to the lateral direction decreases with increasing lateral distance from the first recess. This feature may further improve the performance of the field plate. A smaller thickness of the dielectric layer increases the field plate's effect on the wide-bandgap semiconductor layer, hence reducing the magnitude of the electrical field in the active region more efficiently; a larger thickness of the dielectric layer provides better protection against voltage breakdown due to dielectric failure. Having a dielectric layer with increasing thickness towards the periphery may provide a higher breakdown voltage by reducing the critical field crowding in the periphery of the active region and shifting it towards the circumferential edge of the field plate, whilst reducing the risk of dielectric failure at this location by means of a thicker dielectric layer.

In an exemplary embodiment the dielectric layer has a thickness adjacent to the first recess which is in a range between 0.02 µm and 1 µm, exemplarily between 0.02 µm and 0.5 µm and more exemplarily between 0.02 µm and 0.3 µm.

The thickness of the dielectric layer may be smaller than in state of the art devices because the field relief due to the mesa structure reduces the risk of voltage breakdown caused by dielectric failure. A thinner dielectric layer is beneficial for reducing the field crowding at the periphery of the active region.

In an exemplary embodiment the field plate comprises at least one of aluminum, nickel, tungsten, and chromium. A field plate comprising one of these materials has beneficial properties in view of a fabrication method detailed later.

In an exemplary embodiment the depth of the first recess may be at least 4 µm, exemplarily at least 6 µm.

The depth of the recess determines the magnitude of the electrical field reduction. The deeper the recess, the more suppressed is the electric field crowding and thus the higher the breakdown voltage which can be achieved.

In an exemplary embodiment, the wide-bandgap semiconductor layer comprises one of silicon carbide (SiC), gallium nitride (GaN) and gallium oxide ($Ga_2O_3$). These materials are particularly appropriate for forming a wide-bandgap semiconductor layer.

The object of the invention is also attained by a method for manufacturing a power semiconductor device. The method comprising the following steps: providing a wide-bandgap semiconductor layer having a first main side and a second main side opposite to the first main side, wherein the first and the second main side extend in a lateral direction and wherein the wide-bandgap semiconductor layer comprises the active region and the termination region laterally surrounding the active region; forming a field plate on the first main side of the wide-bandgap semiconductor layer, the field plate exposing a first portion of the first main side of the wide-bandgap semiconductor layer in the termination region; and anisotropic etching of the wide-bandgap semiconductor layer in areas where the field plate exposes the first portion of the first main side of the wide-bandgap semiconductor layer in the termination region to form a first recess in the wide-bandgap semiconductor layer in the termination region wherein the first recess surrounds the active region and a sidewall of the first recess adjacent to the active region is laterally aligned with a circumferential edge of the field plate such that in an orthogonal projection onto a plane parallel to the first main side the edge of the recess defined by the upper end of the sidewall is within less than 1 µm from the circumferential edge of the field plate, exemplarily less than 0.5 µm, exemplarily less than 0.2 µm. The method according to the invention is characterized in that the step of forming the field plate comprises: forming a dielectric layer on the first main side of the wide-bandgap semiconductor layer; forming a metal layer on the dielectric layer; and patterning the metal layer and the dielectric layer to expose at least the first portion of the first main side of the wide-bandgap semiconductor layer in the termination region (AR) where the first recess is to be formed in the step of anisotropic etching, wherein in the step of anisotropic etching the patterned metal layer is used at least as a part of an etching mask, and wherein the patterned metal layer in the termination region forms the field plate in the power semiconductor device.

As in the method of the invention areas in the termination region that are exposed by the field plate are etched in the step of anisotropic etching, an outer circumferential edge of the field plate is self-aligned with a sidewall of the first recess formed in the step of anisotropic etching. The recess formed in the step of anisotropic etching forms a mesa edge termination thus an edge termination by a process free of any implantation step. The field plate protects areas of the wide-bandgap semiconductor layer that shall not be etched during the step of anisotropic etching. Accordingly, a deep SiC etch can be performed more reliably and the sidewall of the first recess and the circumferential edge of the field plate are mutually aligned in lateral direction with high precision. Consequently, as it is discussed above, because of the precise alignment, the electric field crowding below the circumferential edge of the field plate can be efficiently reduced by the mesa edge termination thus resulting in a device providing higher breakdown voltage.

Using a patterned metal layer as the field plate and as an etching mask in the step of anisotropic etching is advantageous compared to using an etching mask made of photoresist because metal is more resistant to etchants, that are used in the step of anisotropic etching of the wide-bandgap semiconductor layer, than photoresist. As discussed above, using the dielectric layer between the wide-bandgap semiconductor layer and the field plate amplifies the effect of the field plate and provides additional electric field relief.

In an exemplary embodiment the dielectric layer is patterned before the step of forming the metal layer to form an opening in the dielectric layer that exposes at least a second portion of the first main side of the wide-bandgap semiconductor layer in the active region.

Pattering the dielectric layer before patterning the metal layer enables the formation of advantageous shapes of the dielectric layer. For example, the dielectric layer may be formed such that its thickness decreases with increasing lateral distance from the first recess. As discussed above, a dielectric layer with such a shape may yield beneficial electric field characteristics.

In addition, in an exemplary embodiment, a metal layer is formed to be in direct contact with the first main side of the wide-bandgap semiconductor layer through the opening in the dielectric layer.

This metal layer can serve as a contact electrode for electrically connecting the device. The contact electrode may, for example, comprise a Schottky contact. Advantageously, by forming the metal layer on the patterned dielectric layer, the field plate and the contact electrode are formed simultaneously, i.e. in the same method step. Thus, ease of fabrication is achieved, potentially resulting in a more cost efficient manufacturing process.

In an exemplary embodiment the patterned metal layer and the patterned dielectric layer expose a third portion of the first main side of the wide-bandgap semiconductor layer in the active region, and a second recess is formed in the active region in the step of anisotropic etching together with the first recess using the patterned metal layer as the etching mask and filled with a filling material.

Simultaneous etching of the first recess and the second recess is enabled by using the field plate as the etching mask. Accordingly, more efficient fabrication of a power semiconductor device is enabled. Moreover, due to the simultaneous etching, the first recess and the second recess can be fabricated with the same depth.

In an exemplary embodiment, the patterned metal layer and the patterned dielectric layer expose a fourth portion of the first main side of the wide-bandgap semiconductor layer in the active region. The method further comprises a step of forming a contact electrode in direct contact with the fourth portion of the first main side of the wide-bandgap semiconductor layer before the anisotropic etching of the wide-bandgap semiconductor layer, and the contact electrode is used together with the patterned metal layer as the etching mask in the step of anisotropic etching of the wide-bandgap semiconductor layer.

By using the contact electrode together with the patterned metal layer as the etching mask for etching the wide-bandgap semiconductor layer, an additional processing step can be avoided, thus manufacturing of a power semiconductor device is facilitated. For example, the contact electrode prevents the etching of the wide-bandgap semiconductor layer in the active region during the etching of the first recess. Therefore the use of an additional etching mask shielding the wide-bandgap semiconductor layer in the active region can be avoided.

In an exemplary embodiment the step of forming the field plate comprises: forming the dielectric layer on the first main side of the wide-bandgap semiconductor layer; forming a first metal layer on the dielectric layer; and forming a second metal layer on the first metal layer, wherein the first and the second metal layer are formed of different metals; patterning the second metal layer, the first metal layer and the dielectric layer to expose at least the first portion of the first main side of the wide-bandgap semiconductor layer in the termination region where the first recess is to be formed in the step of anisotropic etching, wherein, in the step of anisotropic etching, the first and the second metal layer are used at least as a part of an etching mask, and wherein the patterned first metal layer in the termination region forms at least part of the field plate in the power semiconductor device.

As the first metal layer and the second layer are formed of different metals, the first metal layer can serve as an etch stop for an etchant used for etching the second metal layer and thus prevent etching of the dielectric layer and wide-bandgap semiconductor layer underneath. An etching mask comprising both the first metal layer and the second metal layer enables forming a particularly well defined sidewall of the first recess in the wide-bandgap semiconductor layer. As a consequence the breakdown voltage of the power semiconductor may be further improved.

In an exemplary embodiment the step of patterning the second metal layer, the first metal layer and the dielectric layer further comprises: patterning the second metal layer to expose the first metal layer in areas of the first portion of the first main side of the wide-bandgap semiconductor layer in the termination region; forming trenches in the second metal layer in the active region to expose the first metal layer at the bottom of the trenches, refilling the trenches at least partially by a filling material, and patterning the first metal layer and the dielectric layer by anisotropic etching using the second metal layer and the filling material as an etching mask. In addition, the method comprises the following steps: removing the filling material after the step of patterning the first metal layer and the dielectric layer; thereafter removing a portion of the second metal layer in which the trenches are formed by isotropic etching of portions respectively separating neighbouring trenches; thereafter removing portions of the first metal layer and of the dielectric layer in the active region by anisotropic etching using the second metal layer as an etching mask to expose a fifth portion of the first main side of the wide-bandgap semiconductor layer in the active region; and forming a contact electrode contacting the fifth portion of the first main side of the wide-bandgap semiconductor layer.

This embodiment provides an alternative for fabricating the power semiconductor device according to the invention.

BRIEF DESCRIPTION OF THE DRAWINGS

Detailed embodiments of the invention will be explained below with reference to the accompanying figures, in which.

The reference signs used in the figures and their meanings are summarized in the list of reference signs. Generally, similar elements have the same reference signs throughout the specification. In order to increase visibility, dimensions are not to scale. However, this does not exclude that they consist of the same material or that severally components are integrally formed. The described embodiments are meant as examples and shall not limit the scope of the invention.

DETAILED DESCRIPTION OF EXEMPLARY EMBODIMENTS

Hereinafter exemplary embodiments of the semiconductor device according to the invention and manufacturing methods are described in detail. The power semiconductor device is, for example, a silicon carbide (SiC) Schottky diode.

First Embodiment

Figure 1A:
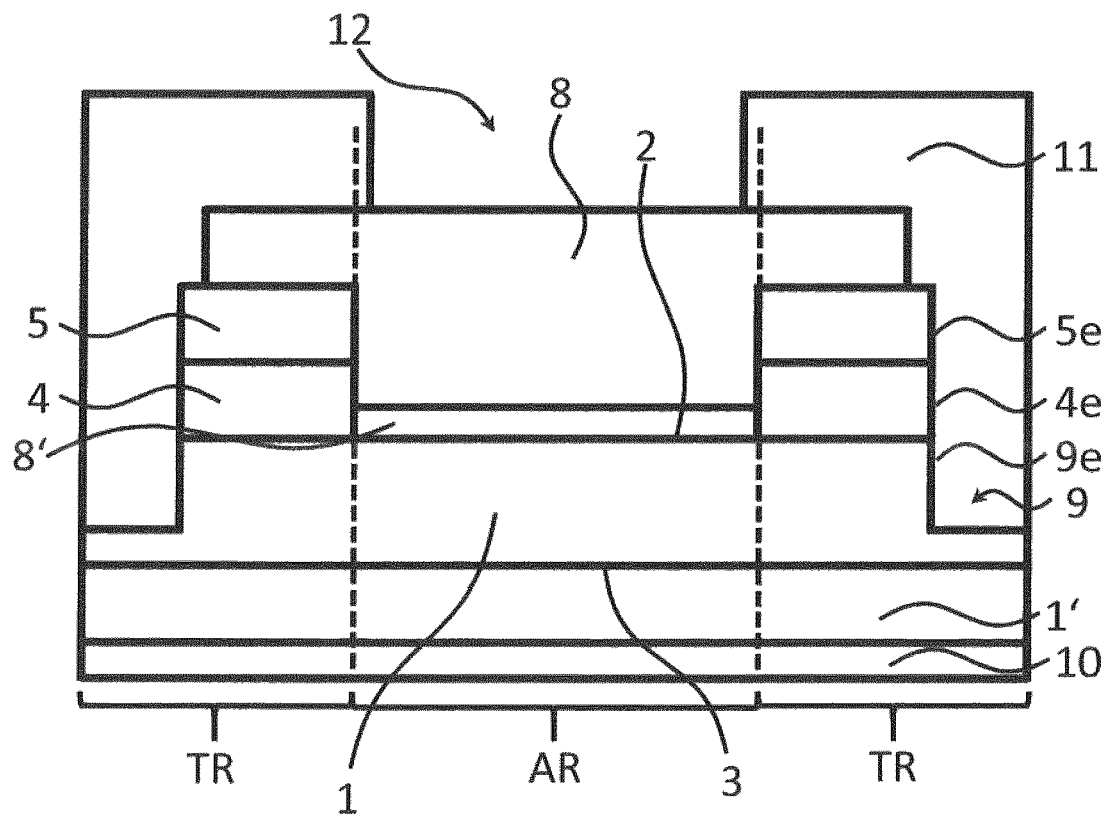
FIG. 1A illustrates an exemplary first embodiment of a power semiconductor device according to the invention.
Figure 1B:
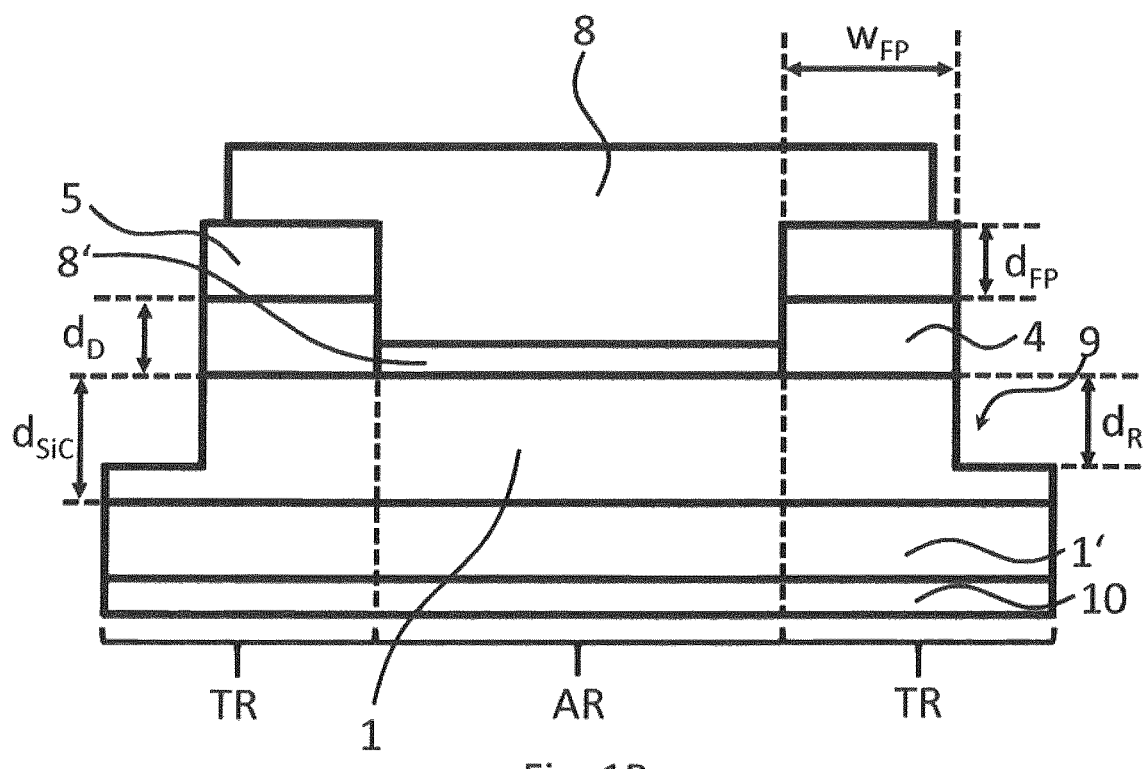
FIG. 1B illustrates dimensions used for describing embodiments according to the invention.

Referring to FIGS. 1A and 1B, an exemplary embodiment according to the invention comprises an n-type silicon carbide (SiC) layer 1, an n$^+$-type SiC substrate 1', a dielectric layer 4, a field plate 5, a first recess 9, a backside electrode 10, a frontside electrode (contact electrode 8) and a passivation layer 11.

The SiC layer 1 (an example of the wide-bandgap semiconductor layer 1 in the claims) is formed on the SiC substrate 1', has exemplarily a relatively low doping concentration of $10^{17}$ cm$^{-3}$ or less and forms the drift layer in the final power semiconductor device. The SiC substrate 1' has, for example, a higher doping concentration of $10^{18}$ cm$^{-3}$ or more and is formed on the backside electrode 10. Appropriate doping profiles of the SiC layer 1 and the SiC substrate 1' for use in a Schottky diode are well known in the prior art. The SiC layer 1 has a first main side 2 and a second main side 3. The first main side 2 and the second main side 3 extend in a lateral direction. The first main side 2 corresponds to a plane through the outermost part of the SiC layer 1 on a side opposite to the second main side 3. The SiC layer 1 comprises an active region AR and a termination region TR laterally surrounding the active region AR. The material of the SiC layer 1 and of the SiC substrate 1' may be any polytype of SiC such as 4H-SiC, 6H-SiC or 3C-SiC, for example. A layer thickness $d_{SiC}$ of the SiC layer 1 depends on the nominal blocking voltage of the power semiconductor device. The layer thickness $d_{SiC}$ of the SiC layer 1 is defined as the largest distance between the first main side 2 and the second main side 3 in a direction perpendicular to the first main side 2 (see FIG. 1B). The layer thickness $d_{SiC}$ of the SiC layer 1 may be in the range from 5 µm to over 100 µm, and exemplary is in the range between 5 and 30 µm, more exemplarily between 5 µm and 20 µm.

The dielectric layer 4 is located between the first main side 2 of the SiC layer 1 and the field plate 5. The dielectric layer exposes a first portion 9 of the of the SiC layer 1 in the termination region TR. The dielectric layer 9 exposes a second portion of the SiC layer 1 in the active region AR. The dielectric layer 4 can comprise any dielectric material as long as it can be formed on the SiC layer 1 (e.g. by depositing or growing) and patterned (e.g. by dry or wet etching or by lift-off or shadow mask). The dielectric layer 4 can be an oxide layer (e.g. a silicon oxide layer), or a nitride layer (e.g. a silicon nitride layer), or an oxynitride layer, for example. It can also comprise different dielectric materials in an alloy or in a stack of layers. The thickness of the dielectric layer has an influence on the electric field relief that can be achieved by means of a field plate. The thinner the dielectric layer 4, the higher the breakdown voltage VBR which can be achieved. The dielectric layer thickness can, for example, be smaller as in prior art devices. For example, the thickness do of the dielectric layer 4 adjacent to the first recess is in a range between 0.02 µm and 1 µm, exemplarily between 0.02 µm and 0.5 µm and more exemplarily between 0.02 µm and 0.3 µm, wherein the thickness do of the dielectric layer 4 is defined as the distance between the intersection points of a line perpendicular to the first main side 2 with the upper surface and lower surface of the dielectric layer 4 (see FIG. 1B).

The field plate 5 is formed on the dielectric layer 4. The field plate 5 exposes the first portion of the SiC layer 1 in the termination region TR. The field plate 5 exposes a third portion of the SiC layer 1 in the active region AR. Exemplarily, the field plate is formed out of metal but other materials are also appropriate as long as they are conducting and patternable. The field plate 5 may comprise, for example, one of aluminium (Al), nickel (Ni), tungsten (W) or chrome (Cr). The field plate 5 may comprise an alloy or different metals in a stack of layers. For example, the thickness $d_{FP}$ of the field plate 5, defined as the distance between the upper surface of the field plate 5 and the lower surface of the field plate (see FIG. 1B), is in a range between 1 µm and 500 µm, exemplarily between 1 µm and 100 µm and more exemplarily between 1 µm and 20 µm. The lateral dimension $w_{FP}$ of the field plate 5, defined as the distance from an edge of the field plate adjacent to the active region to an edge of the field plate adjacent to the first recess 9 (see FIG. 1B) is in the range of 1.5 µm and 1500 µm.

The first recess 9 is formed in the termination region TR of the SiC layer 1. The first recess 9 is recessed from the first main side 2 of the SiC layer 1 and surrounds the active region AR. The recess is formed in the first portion of the SiC layer 1 exposed by the field plate 5. A sidewall 9e of the first recess 9 adjacent to the active region AR is laterally aligned with a circumferential edge 5e (outer edge) of the field plate such that in an orthogonal projection onto a plane parallel to the first main side 2 an edge of the recess defined by the upper end of the sidewall is within less than 1 µm from the circumferential edge of the field plate 5, exemplarily less than 0.5 µm, exemplarily less than 0.2 µm. Thus, the sidewall 9e has a thickness (distance) between the first main side 2 and the upper surface of the field plate 5, which is the side of the field plate opposite to the SiC layer.

The first recess 9 in the termination region TR forms a mesa edge termination structure. For example, the depth $d_R$ of the recess is at least 2% of the layer thickness $d_{SiC}$ of the SiC layer 1, exemplary at least 30%, more exemplarily at least 50%. For example, the lateral dimension of the recess $w_R$ is at least 10% of the layer thickness of the SiC layer 1, exemplarily at least 50%, more exemplarily at least 200%.

For example, in an exemplary embodiment the SiC layer 1 has a thickness $d_{SiC}$ of 15 µm; the dielectric layer 4 has a thickness do in the range of 0.2 µm-0.5 µm; the field plate lateral dimension $w_{FP}$ is in the range of 1.5 µm and 1500 µm and the depth $d_R$ of the first recess 9 is between 150 nm and 30 µm. When the recess 9 is deeper than the thickness of the SiC layer 1 ($d_R>d_{SiC}$), then the recess 9 continues in the SiC substrate 1'.

The contact electrode 8 is formed in direct contact with a fourth portion of the first main side 2 of the silicon carbide layer 1 in the active region AR. Here, the contact portion 8' of the contact electrode 8 forms a Schottky contact with the SiC layer 1. Any metal appropriate for a Schottky contact can be used as a material. Titanium (Ti) or nickel (Ni) are known as materials appropriate for a Schottky contact to SiC and may be used in the contact portion 8', for example. The contact electrode 8 may further comprise an alloy or different metals in a stack of layers. For example, an additional electrode layer may be formed on the contact portion 8' of the contact electrode 8 to form an ohmic contact to the contact portion 8'. The contact electrode 8 may overlap with a portion of the field plate 5. The contact electrode 8 may be electrically connected to the field plate 5 and may be formed by the same material or a different one.

A passivation layer 11 may be formed on the whole front side of the semiconductor device. The passivation layer 11 may further comprise an opening 12 to expose the upper side of the contact electrode 8 for electrically contacting it from the outside.

Second Embodiment

Figure 1C:
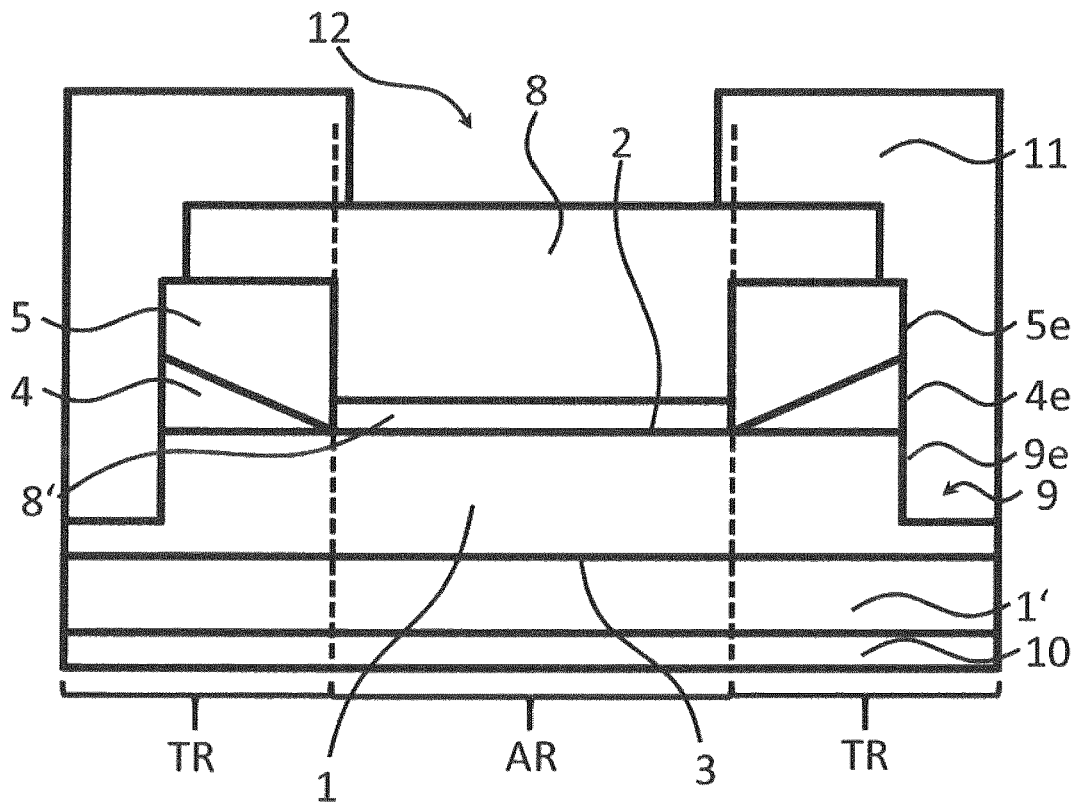
FIG. 1C illustrates an exemplary second embodiment of a power semiconductor device according to the invention in which the thickness of the dielectric layer increases in a lateral direction away from the active region.

A second embodiment according to the invention is described with reference to FIG. 1C. Due to the many similarities between the first embodiment and the second embodiment only differences of the first embodiment to the second embodiment are discussed. The remaining features are the same as in the first embodiment and for an explanation thereof it is referred to the first embodiment discussed above with reference to FIGS. 1A to 1B. In contrast to the first embodiment, dielectric layer 4 is formed such that its thickness do increases with increasing lateral distance from the active region AR. The thickness do may increase from a first value to a second value. The thickness may increase continuously from a first value to a second value. The angle between the straight line connecting the first value and the second value and a plane parallel to the first main side may be in the range between 0.1° and 90°, exemplarily between 1° and 10°, more exemplarily between 1° and 5°. The first value may be 0 or a larger value, the second value is larger than the first value, for example larger than 0.05 µm, or larger than 0.1 µm or larger than 0.5 µm. The smaller thickness do of the dielectric layer 4 in proximity to the active region AR increases the field plate's effect on the electrical charges in the silicon carbide layer 1, hence reducing the magnitude of the electrical field in the active region AR more efficiently. The larger thickness do of the dielectric layer 4 below the circumferential edge 5e of the field plate 5 provides better protection against voltage breakdown due to dielectric failure.

Third Embodiment

Figure 1D:
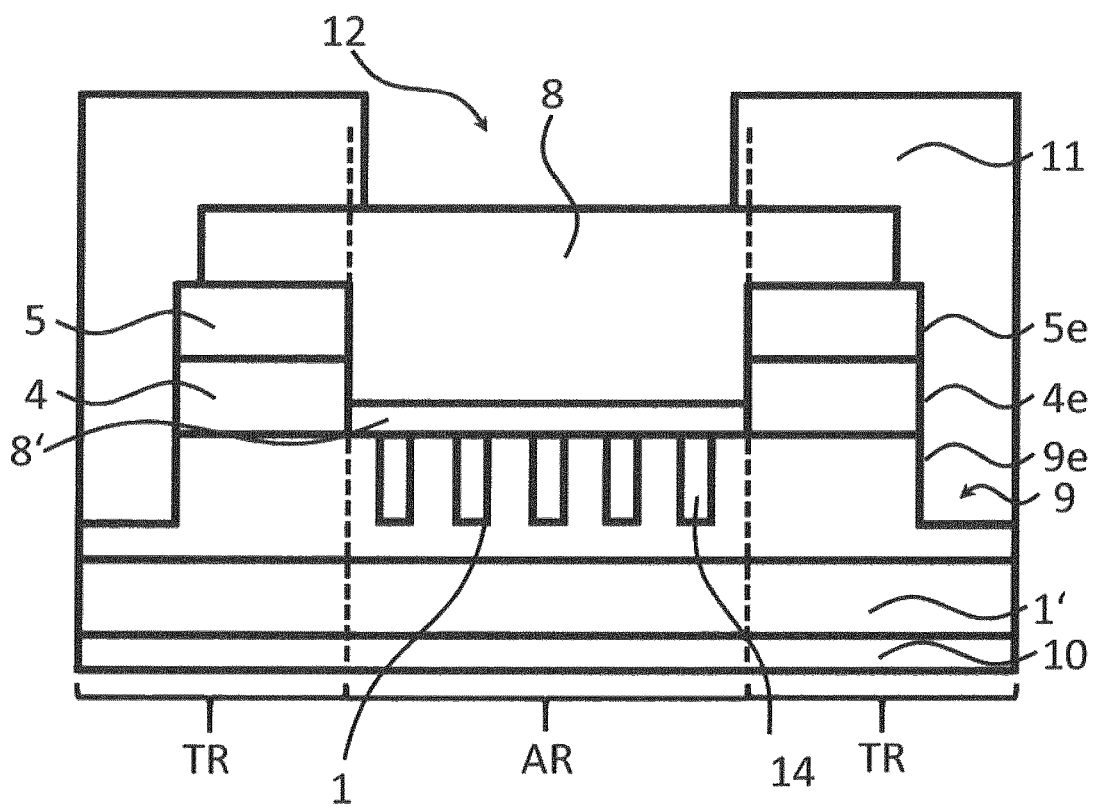
FIG. 1D illustrates an exemplary third embodiment of a power semiconductor device according to the invention in which trenches are formed in the active region.

A third embodiment according to the invention is described with reference to FIG. 1D. Due to the many similarities between the first embodiment and the third embodiment only differences of the first embodiment to the third embodiment are discussed. The remaining features are the same as in the first embodiment and for an explanation thereof it is referred to the first embodiment discussed above with reference to FIGS. 1A and 1B. The third embodiment differs from the first embodiment in that the active region AR of the SiC layer 1 also comprises at least one second recess 14 which has the same depth as the first recess 9 in the termination region TR. The at least one second recess 14 is filled with some filling material, for example insulating material such as a dielectric material or an oxide. This configuration may have a positive effect on leakage currents. The third embodiment may also have the dielectric layer 4 with increasing thickness as shown in the second embodiment.

Manufacturing Method for the First Embodiment

In the following there is explained a method for manufacturing the power semiconductor device according to the first embodiment of the invention (FIG. 1A) with reference to FIGS. 2A to 2I. Points discussed with respect to the first embodiment are valid for the following and complete the description.

Figure 2A:
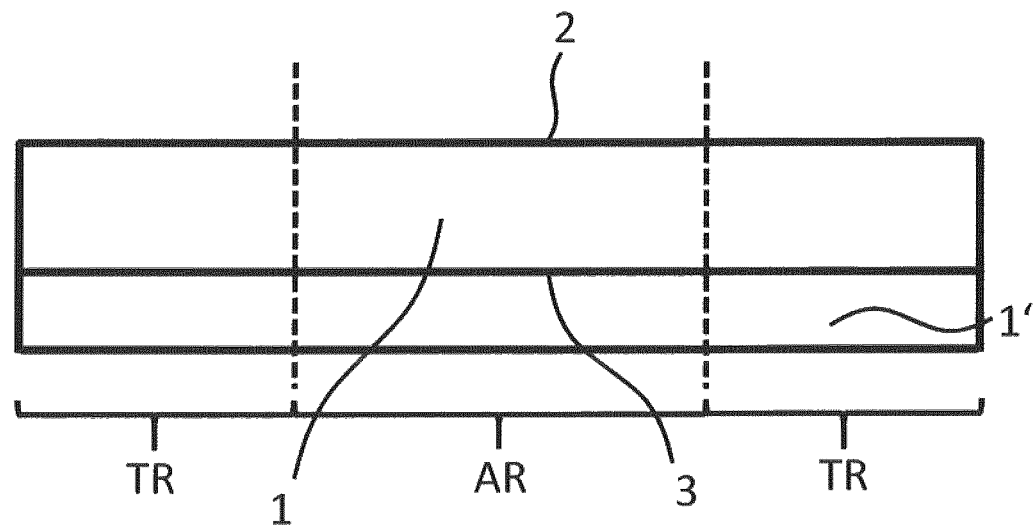
FIGS. 2A to 2I illustrate method steps in a first exemplary method for manufacturing the first embodiment of a power semiconductor device according to the invention shown in FIG. 1A.

In a first method step illustrated in FIG. 2A, there is provided the n-type silicon carbide (SiC) substrate 1' with the lower doped SiC layer 1 forming the drift region. For example, the SiC layer is formed by means of epitaxy. The SiC layer 1 has a first main side 2 and a second main side 3 extending in a lateral direction as shown in FIG. 2A. The SiC layer 1 comprises an active region AR and a termination region TR laterally surrounding the active region AR.

Figure 2B:
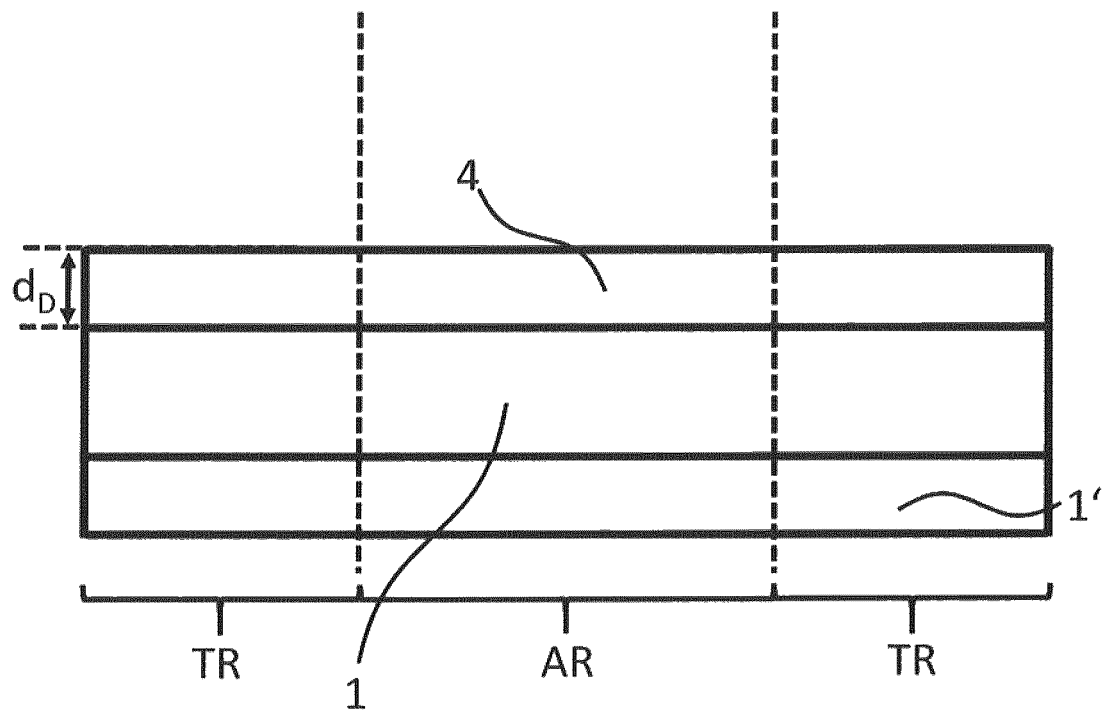

The dielectric layer 4 is formed in a next step on the first main side 2 of the SiC layer 1 as illustrated in FIG. 2B. The dielectric layer 4 covers the entire active region AR and the entire termination region TR. The dielectric layer 4 is in direct contact with the SiC layer 1.

Figure 2C:
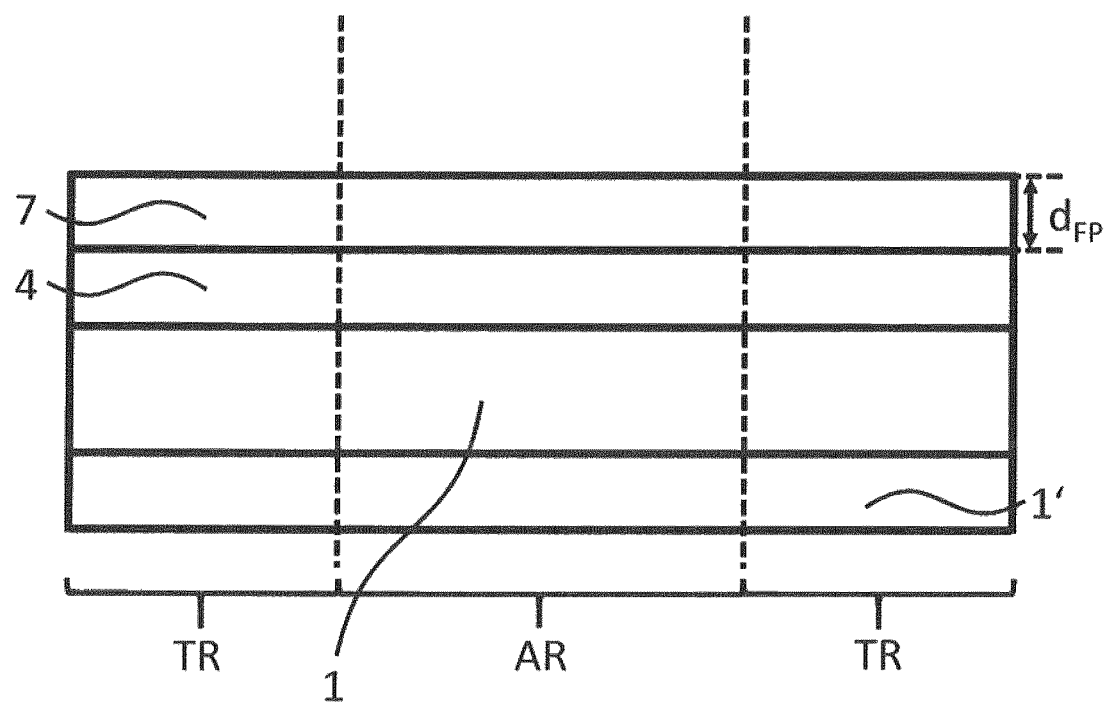

Next, a metal layer 7 is formed on the dielectric layer 4 as illustrated in FIG. 2C. The metal layer 7 covers the entire active region AR and the entire termination region TR. The metal layer 7 is formed in direct contact with the dielectric layer 4. Preferentially, the metal used for forming the metal layer 7 is hardly etchable with an etchant used for SiC etching. In other words, the metal used for forming the metal layer 7 is preferentially such that it erodes less than SiC in an etching process described later. For example, the metal layer 7 may comprise one of the field plate materials discussed with respect to the first embodiment and may have the same thickness.

Figure 2D:
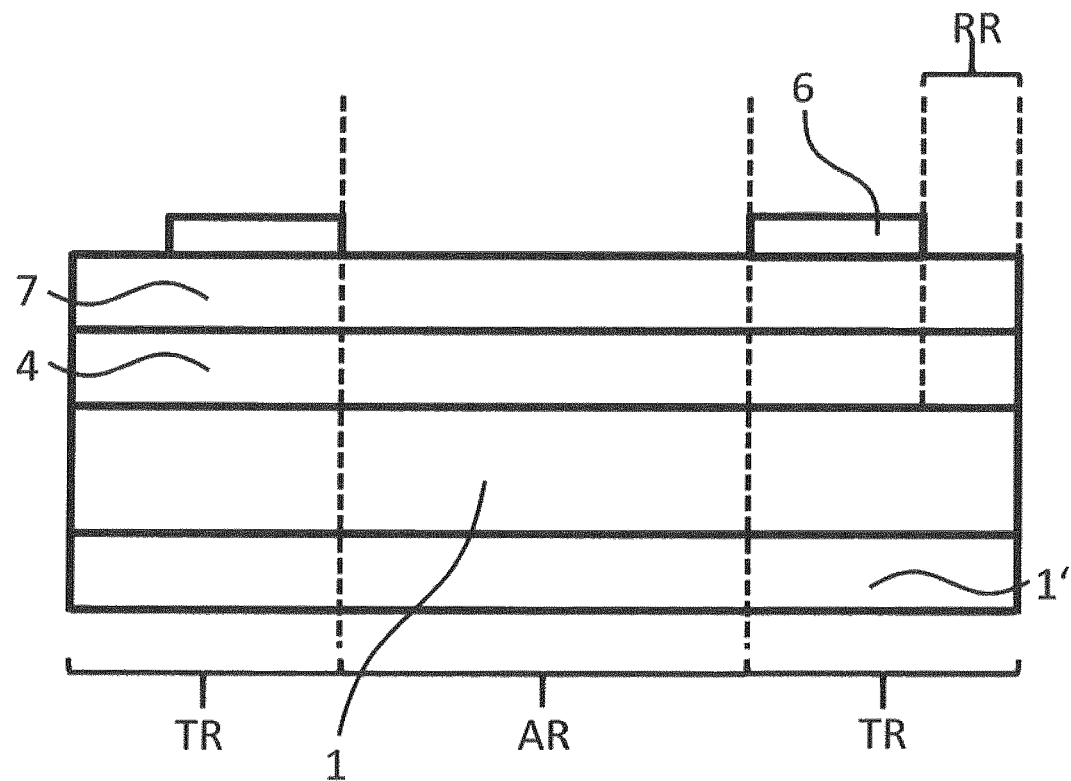

In a next step, the metal layer 7 is patterned. For this, an etching mask 6 is formed on the metal layer 7 as shown in FIG. 2D. The etching mask 6 is formed such that it exposes at least a portion (an example of a first portion in the claims) of the metal layer 7 covering the termination region TR. The etching mask 6 may also expose a portion of the metal layer 7 covering the active region AR. The etching mask 6 may be a photoresist mask or similar.

Figure 2E:
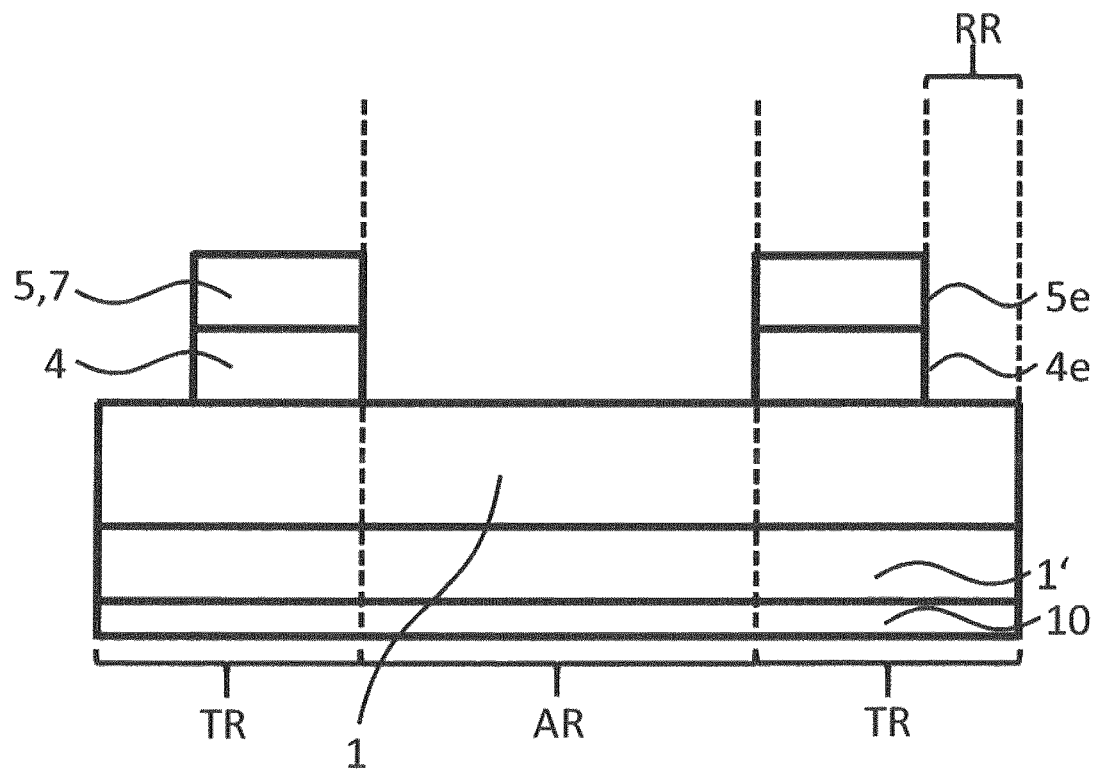
Figure 2F:
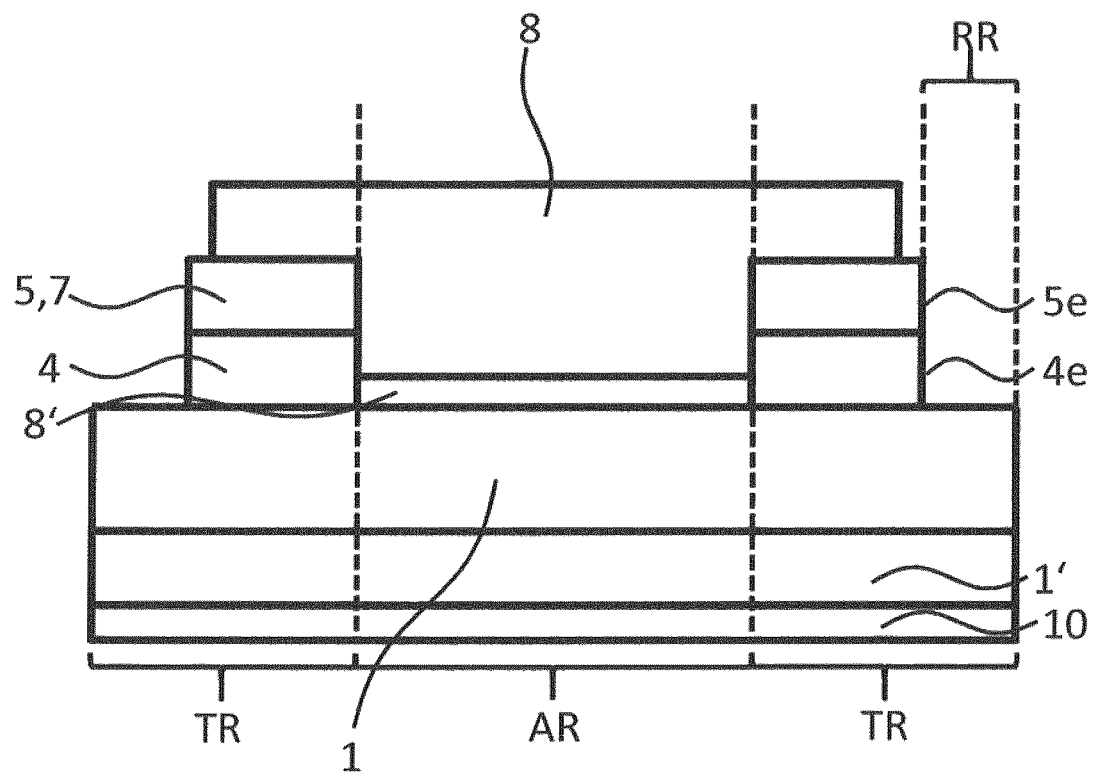

A portion of the metal layer 7 exposed by the etching mask 6 is removed by anisotropic etching. In this way, the field plate 5 is formed. Herein, a portion of the metal layer 7 and a portion of the dielectric layer 4 is removed in the termination region TR, and a portion of the metal layer 7 and the dielectric layer 4 is removed in the active region AR. Due to the anisotropic etching, an edge of the field plate 5 (patterned metal layer 7) is aligned with an edge of the patterned dielectric layer 4. In particular, a circumferential edge 4e of the patterned dielectric layer 4 is laterally aligned with a circumferential edge 5e of the field plate 5 (patterned metal layer 7). The anisotropic etching may be performed by reactive ion etching (RIE) using a chlorine (Cl) based etching gas, for example. The etching mask 6 may be consumed during the etching process or removed afterwards. The resulting structure after the step of anisotropic etching is shown in FIG. 2E.

Next the contact electrode 8 is formed (e.g. by growing or depositing) in direct contact with a portion (an example of the fourth portion in the claims) of the first main side 2 of the silicon carbide layer 1 in the active region AR. Here, the contact portion 8' of the contact electrode 8 forms a Schottky contact with the SiC layer 1. An additional electrode layer (not shown) may be formed on the contact portion 8' to form an ohmic contact to the contact portion 8'.

Figure 2G:
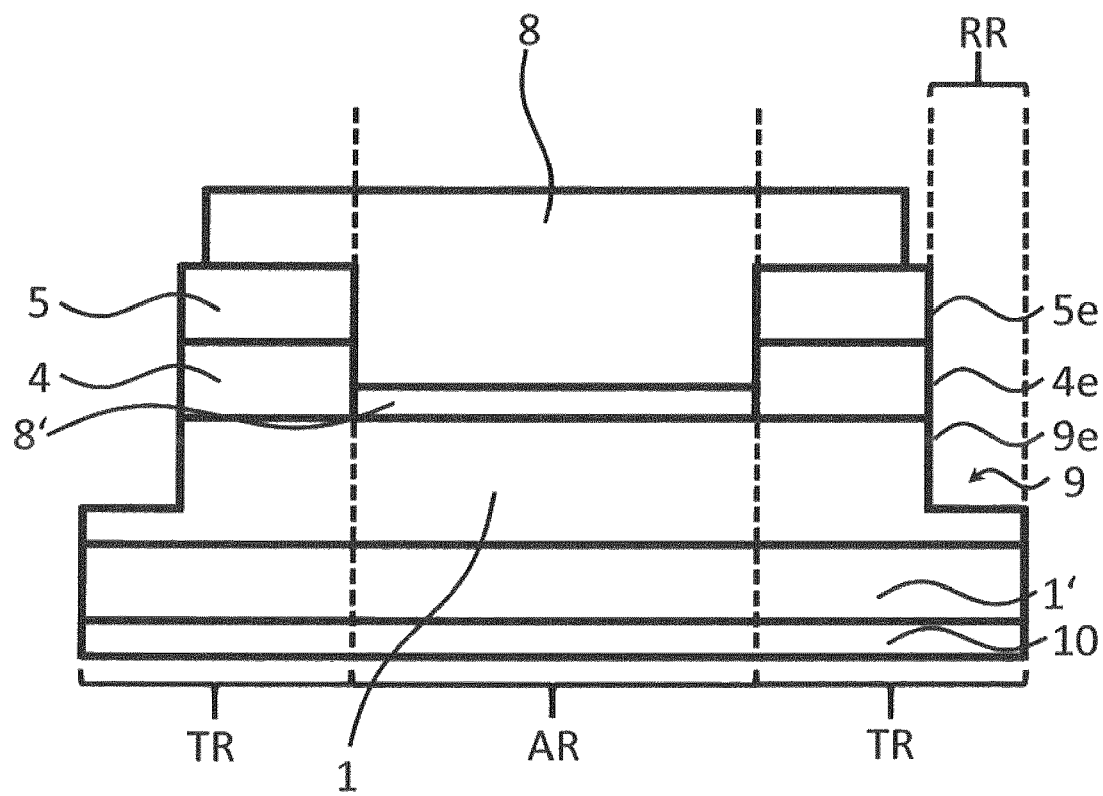

Next the first recess 9 is formed in the SiC layer 1 in the termination region TR by anisotropic etching as illustrated in FIG. 2G. Therein, anisotropic etching is selective against the metal of the field plate 5 (patterned metal layer 7) and the metal of the contact electrode 8, in particular, the metal in the upper part of the contact electrode 8 (i.e. the part facing away from the first main surface 2). In other words, the field plate 5 and the contact electrode 8 (in particular the upper part of the contact electrode 8) are used at least as a part of an etching mask preventing (slowing down) the etching of the material underneath it (i.e. downstream of the etching direction). Anisotropic etching may be performed by RIE using a fluorine (F) based etching gas, for example. The first recess 9 is formed in areas (an example of the first portion in the claims) which are exposed by the field plate 5 and the contact electrode 8. Accordingly, the first recess 9 is only formed in the recess region RR in the termination region TR. The first recess is not formed in the active region AR despite the opening in the field plate 5 because in the active region AR the contact electrode 8 covers the SiC layer 1. Therefore an additional fabrication step of providing an etching mask to prevent etching of the SiC layer in the active region AR can be avoided.

In the step of anisotropic etching of SiC, upper parts (i.e. the parts facing away from the first main surface 2) of the field plate 5 and the contact electrode 8 (both being part of the etching mask) may be partially removed (not shown), in case the etchant is not completely selective against them. However, due to the anisotropic character of the etching process, the lateral dimension of the etching mask (i.e. the field plate 5) is not changed during the etching process when forming the first recess 9, only the thickness of the contact electrode 8 and the field plate 5 is reduced. Thus, by anisotropic etching using the field plate 5 as part of the etching mask, a deep etch of the SiC layer 1 can be formed with high precision such that a sidewall 9e of the first recess 9 is aligned with an edge of the field plate 5. Exemplarily, the sidewall 9e of the first recess 9 adjacent to the active region is laterally aligned with the circumferential edge 5e of the field plate 5 such that in an orthogonal projection onto a plane parallel to the first main side 2 the edge of the first recess defined by the upper end of the sidewall 9e is within less than 1 µm, exemplarily less than 0.5 µm, exemplarily less than 0.2 µm from the circumferential edge 5e of the field plate 5. The first recess 9 in the termination region TR forms a mesa edge termination structure in the final power semiconductor device. The first recess 9 surrounds the active region AR and has for examples the dimensions as discussed with respect to the first embodiment.

Figure 2H:
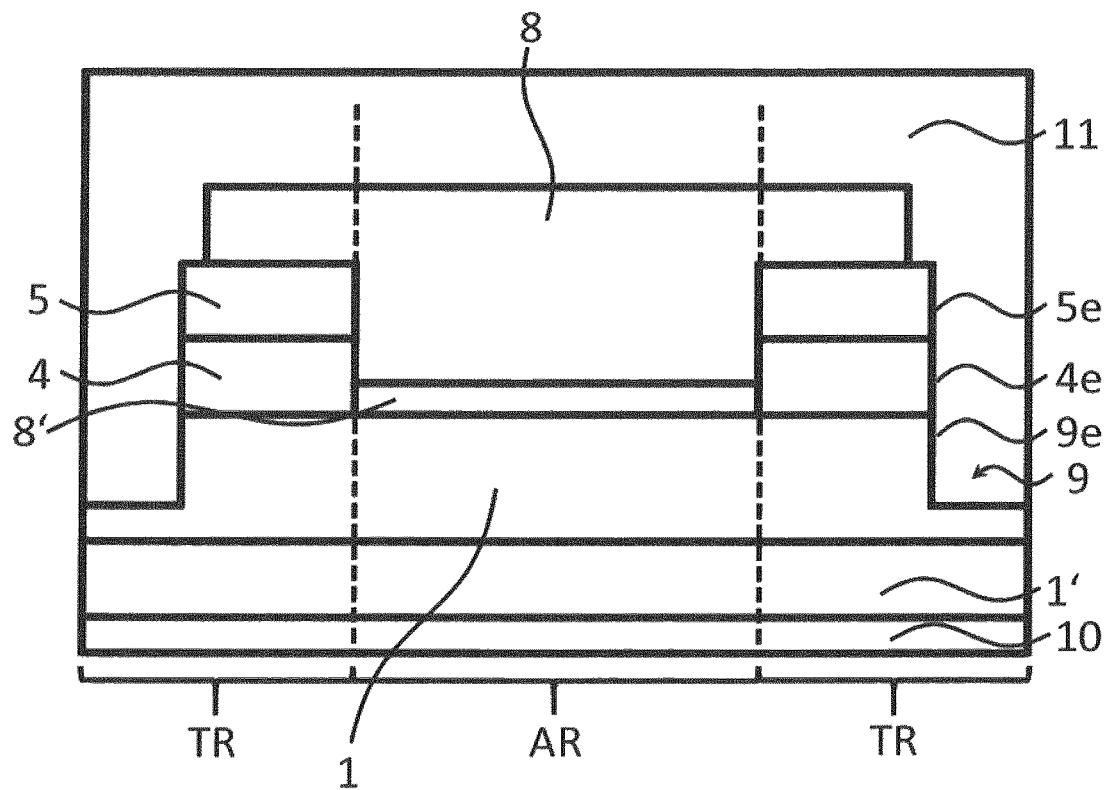
Figure 2I:
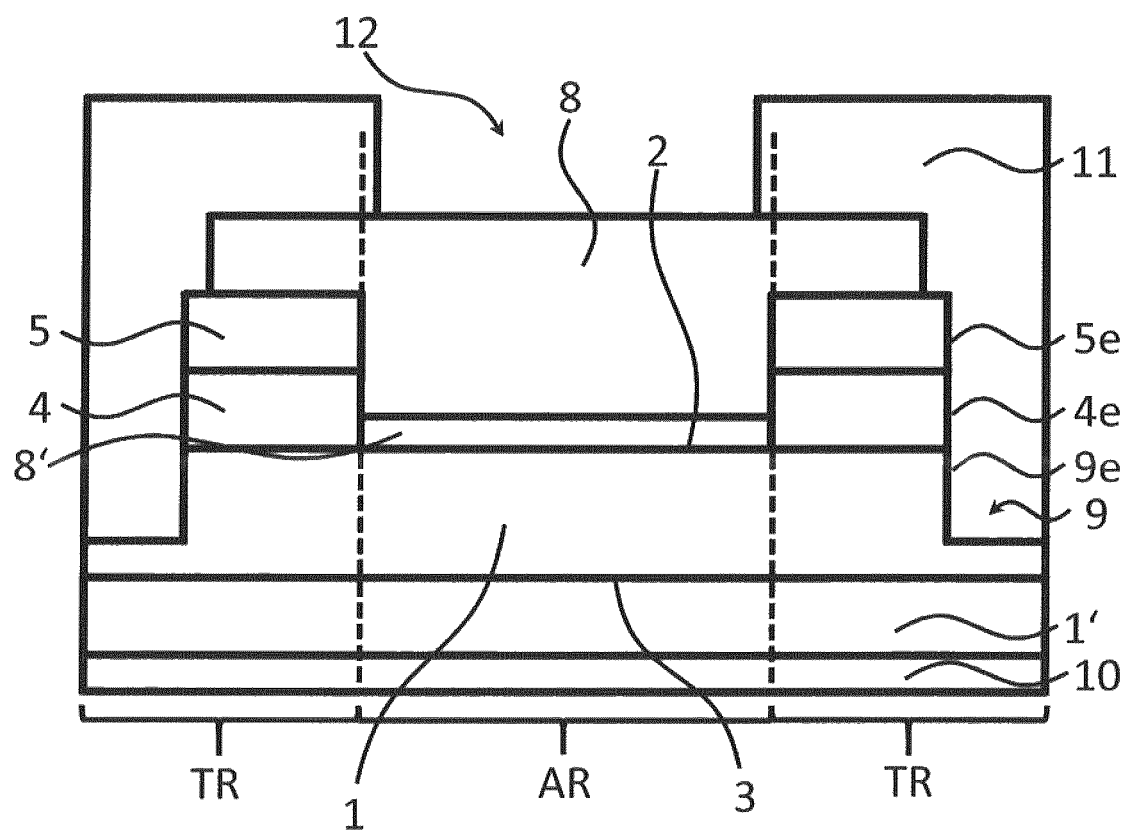

In addition, the backside electrode layer 10 may be formed on the second main side 3. Moreover, a passivation layer 11 may be formed on the whole front side of the device to obtain a structure as shown in FIG. 2H. Finally, as illustrated in FIG. 2I an opening 12 may be formed in the passivation layer 11 to expose the upper side of the contact electrode 8 for electrically contacting it from the outside.

In a modification of this method, the backside electrode 10 may be formed at an earlier step of the method or at a later step of the method. Accordingly, the patterning of the dielectric layer 4 may be performed at an earlier or later step of the method. For example, instead of patterning the dielectric layer 4 together with the metal layer 7 as shown in FIG. 2E, the dielectric layer 4 may be patterned in the step of the anisotropic etching of the SiC layer 1. Then, only the field plate 5 (patterned metal layer 7) is used as an etching mask and the contact electrode 8 is formed after the anisotropic etching of the SiC layer 1. The passivation layer 11 may be formed after the contact electrode 8 has been formed as shown in FIG. 1H. However, the contact electrode 8 may also be formed after the formation of the passivation layer 11. Then, an opening 12 is formed in the passivation layer 11 to expose the SiC layer 1 in the active area AR for contacting the contact electrode 8.

Manufacturing Method for the Second Embodiment

Next, a method for manufacturing a power semiconductor device according to the second embodiment of the invention is explained with reference to FIGS. 3A to 3D starting after the method step shown in FIG. 2B. Due to the many similarities between the method for manufacturing the first embodiment and the method for manufacturing the second embodiment, only differences of the methods discussed. The remaining features are the same as in the method for manufacturing the first embodiment and for an explanation thereof it is referred to the discussions above.

Figure 3A:
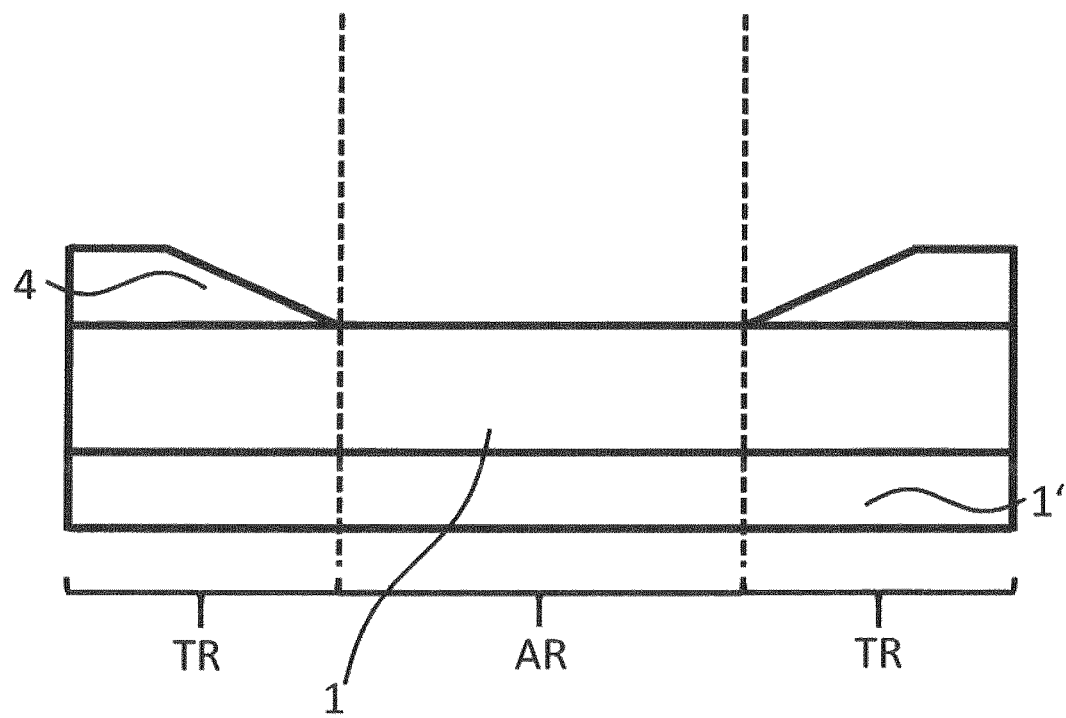
FIGS. 3A to 3D illustrate method steps in a second exemplary method for manufacturing the second embodiment of a power semiconductor device according to the invention shown in FIG. 1B.

The manufacturing method for manufacturing the second embodiment differs from the one described above in that the dielectric layer 4 formed on the first main side 2 of the SiC layer 1 (see FIG. 2B) is patterned before the metal layer 7 is formed on the dielectric layer 4 (see FIG. 3A). This approach provides the advantage that the dielectric layer 4 can be formed in various configurations. For example, the dielectric layer 4 can be formed such that it has an opening exposing a portion (an example of the second portion in the claims) of the SiC layer in the active region AR and/or such that the thickness of the dielectric layer 4 increases with increasing lateral distance from the active region AR.

Figure 3B:
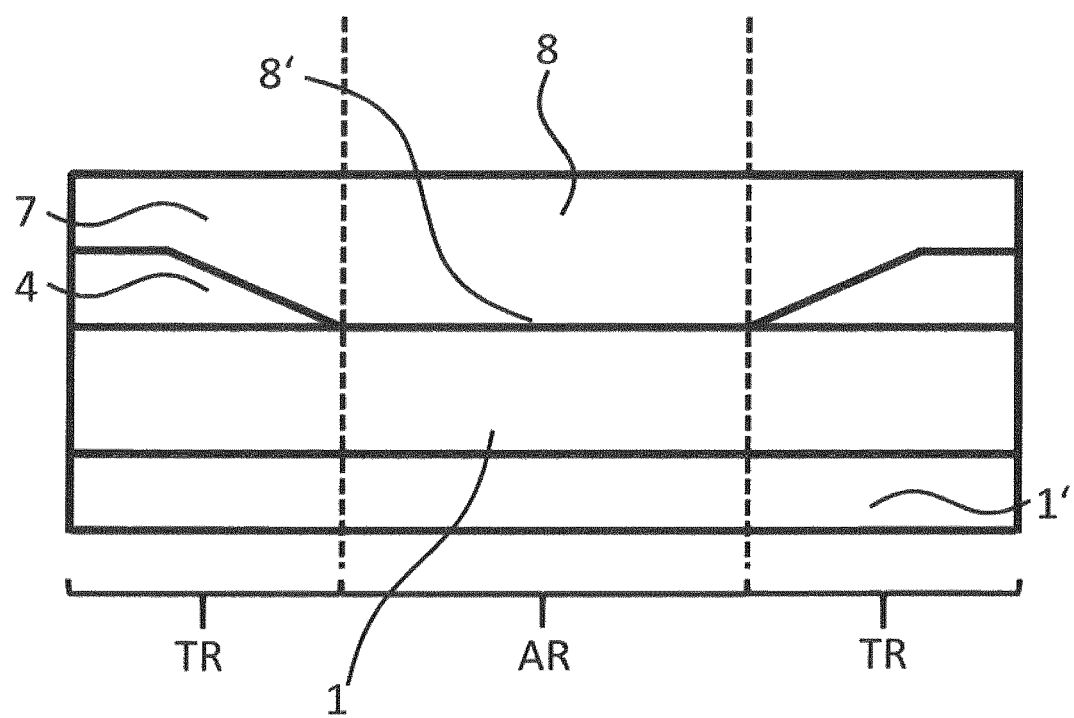
Figure 3C:
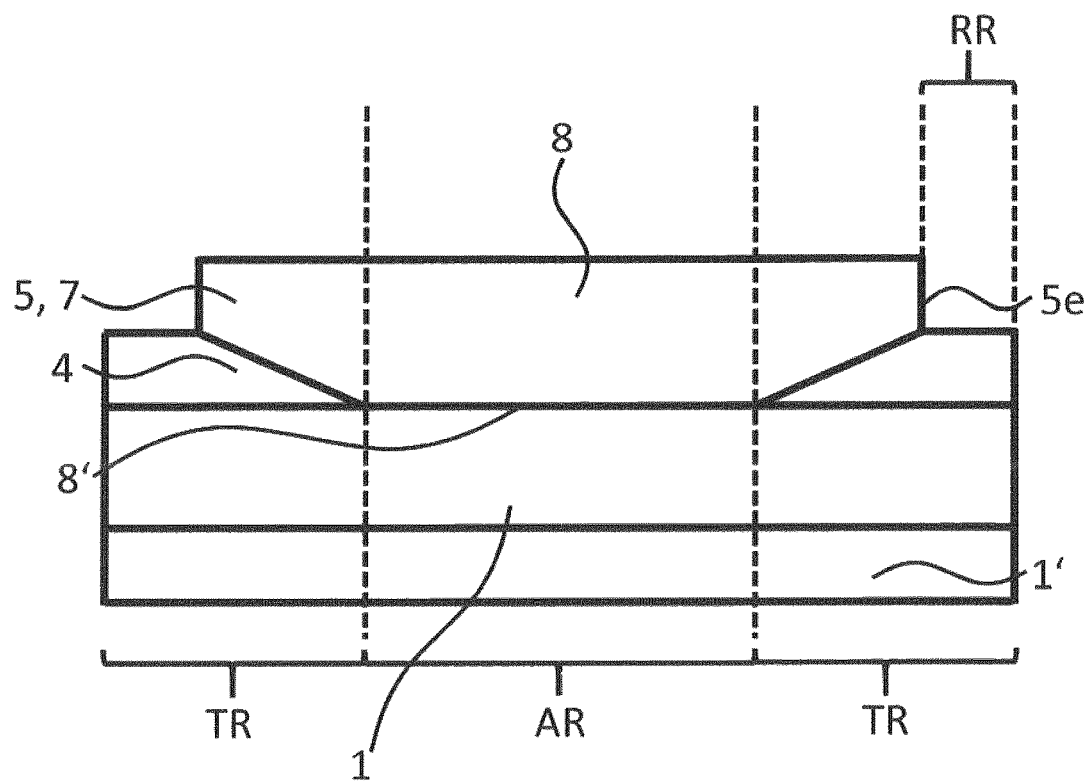
Figure 3D:
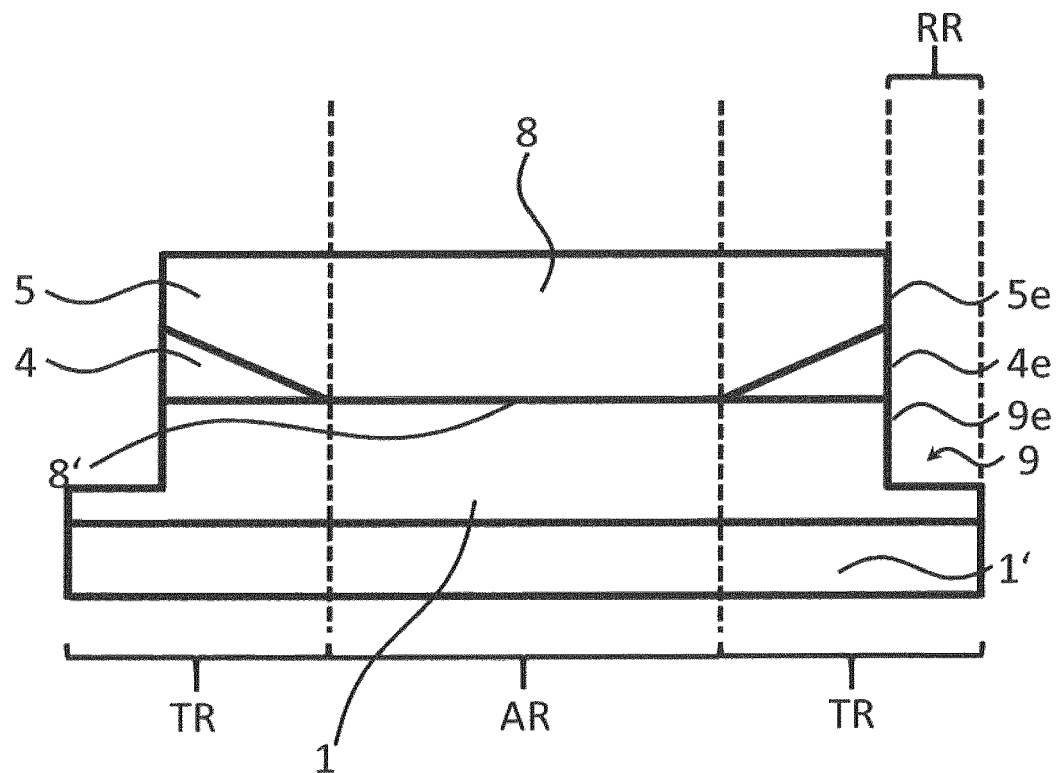

In the next step, a metal layer 7 is formed on the patterned dielectric layer 4 as illustrated in FIG. 3B. In the area where the patterned dielectric layer 4 exposes the first main side 2 of the SiC layer 1 in the active region (as an example of the second portion in the claims), the metal layer 7 contacts the SiC layer 1. Consequently, the metal layer 7 forms a contact electrode 8 in direct contact with a portion of the first main side 2 of the SiC layer 1 as described above with reference to FIG. 2F. In the termination region TR where the dielectric layer 4 is interposed between the metal layer 7 and the SiC layer 1, the metal layer 7 forms a field plate 5. As such, the field plate 5 and the metal contact 7 are integrally formed.

Next (see FIG. 3C), the field plate 5 is patterned to appropriate dimensions as described above with reference to FIG. 2D and to form the etching mask for the anisotropic etching of the SiC layer 1. In the example shown here, only the field plate 5 is patterned. However, alternatively, both the field plate 5 and a portion of the dielectric layer 4 may be patterned in this step as described above with reference to FIG. 2E. Thereafter, the areas (as an example of the first portion in the claims) exposed by the etching mask (i.e. field plate 5) are then etched by anisotropic etching as described above with reference to FIG. 2G to form the first recess 9 in the recess region RR in the termination region TR of the SiC layer 1 (see FIG. 3D). Here, the area (as an example of the first portion in the claims) of the SiC layer 1 exposed by the etching mask (field plate 5) is covered by a portion of the dielectric layer 4. Thus, both a portion of the dielectric layer 4 and a portion of the SiC layer 1 are removed in this etching step. However, in a modification of the method, the portion of the dielectric layer 4 covering the SiC layer 1 in the area exposed by the etching mask (i.e. field plate 5) may have already been removed earlier, such that the etching mask (i.e. field plate 5) directly exposes the area (an example of the first portion in the claims) of the SiC layer 1 where the first recess 9 is to be formed.

Finally, as for the first embodiment, a backside electrode 10 may be added as well as a passivation layer 11 (not shown in FIGS. 3A-3D).

Manufacturing Method for the Third Embodiment

Figure 4A:
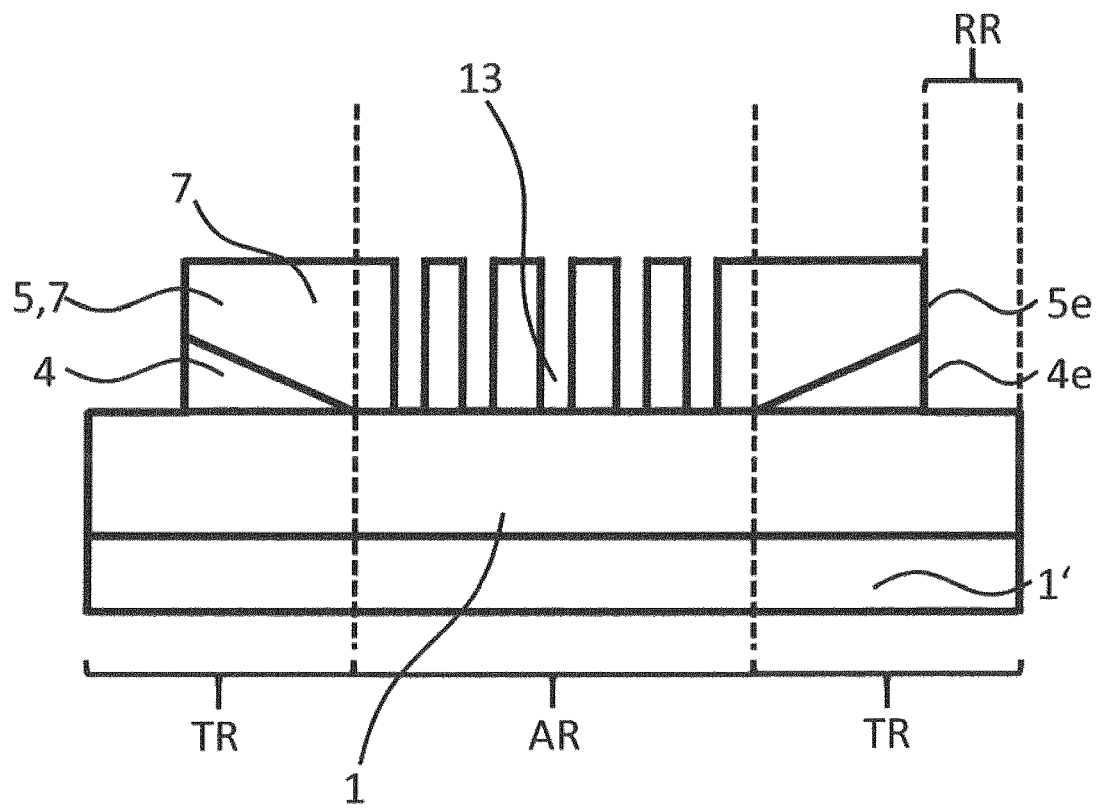
FIGS. 4A and 4B illustrate method steps in a third exemplary method for manufacturing the third embodiment of a power semiconductor device according to the invention shown in FIG. 1C.
Figure 4B:
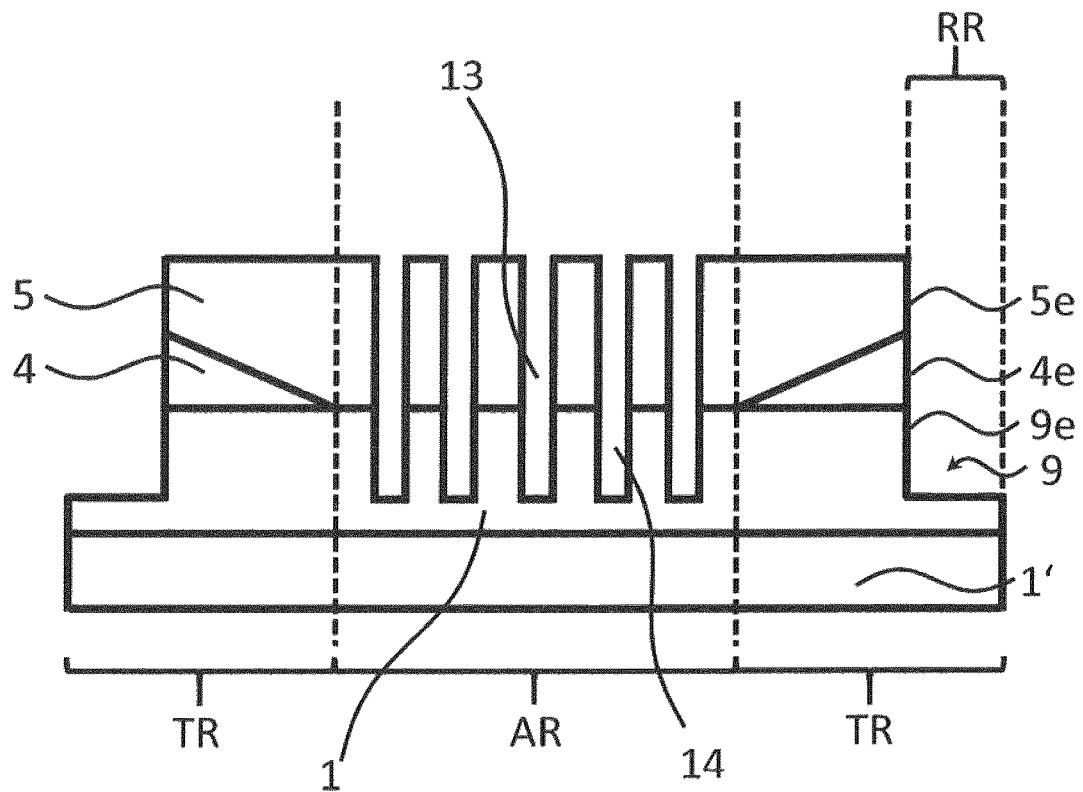

A method for manufacturing the third embodiment according to the invention is described with reference to FIGS. 4A and 4B starting after the method step shown in FIG. 3B. Therein, in the metal layer 7 patterning step described above with reference to FIG. 2E, the metal layer 7 is patterned such that it also exposes at least a portion (an example of the third portion in the claims) of the SiC layer 1 in the active region AR (see FIG. 4A). The portion of the dielectric layer 4 exposed in the termination region TR by the metal layer 7 is removed in the same processing step. For example, the metal layer 7 may be patterned such that it comprises a plurality of ducts 13 exposing a plurality of areas of the SiC layer 1 in the activation region AR. Each duct of the plurality of ducts 13 may have the same cross-section. The cross-sections of the plurality of ducts may however also vary. For example, the ducts 13 may have a circular cross-section or a polygonal cross-section. The diameters of the ducts 13 may, for example, vary between 0.5 μm and 2 μm. The ducts 13 may be regularly distributed. Alternatively the ducts 13 may be irregularly distributed. As illustrated in FIG. 4B, by using the patterned metal layer 7 exposing at least a portion of the SiC layer 1 in the active region as an etching mask in the step of anisotropic etching the SiC layer 1, at least one second recess 14 is formed in the active region AR together with the first recess 9 in the termination region TR. When patterned metal layer 7 comprises a plurality of ducts 13, then a plurality of trenches 14 are formed in the SiC layer 1 in the active region AR. Since the at least one second recess 14 in the active region AR and the first recess 9 in the termination region TR are formed simultaneously in the same etching step, they undergo the same etching duration. Thus, when the SiC layer 1 is directly exposed by the etching mask (field plate 5) or is covered by the same amount of material (e.g. dielectric material), then the at least one second recess 14 in the active region AR and the first recess 9 in the termination region TR have the same depth and their sidewalls are parallel to each other. After this step, for example, the at least one second recess 14 is filled with some filling material (not shown), for example insulating material such as a dielectric material or an oxide. Further, the at least one duct 13 in the metal layer 7 may be filled with a filling material (not shown). The filling material can be the same one as the one used for filling the at least one second recess 14, or a different one, for example the metal of the metal layer 7. Alternatively, a central part of the metal layer 7 coinciding with the active region AR of the SiC layer may be removed, for example by etching, to expose the SiC layer 1 in the active region (not shown), and a contact electrode 8 may be formed as described with reference to FIG. 2F. Finally, a backside electrode 10 and/or a passivation layer 11 may added as described above with reference to FIGS. 2H and 2G.

Alternative Manufacturing Method

Another method to manufacture one of the embodiments according to the invention is described with reference to FIGS. 5A-5H. Due to the many similarities with the methods described above only differences are discussed. The remaining features are the same as explained before and for an explanation thereof it is referred to these.

Figure 5A:
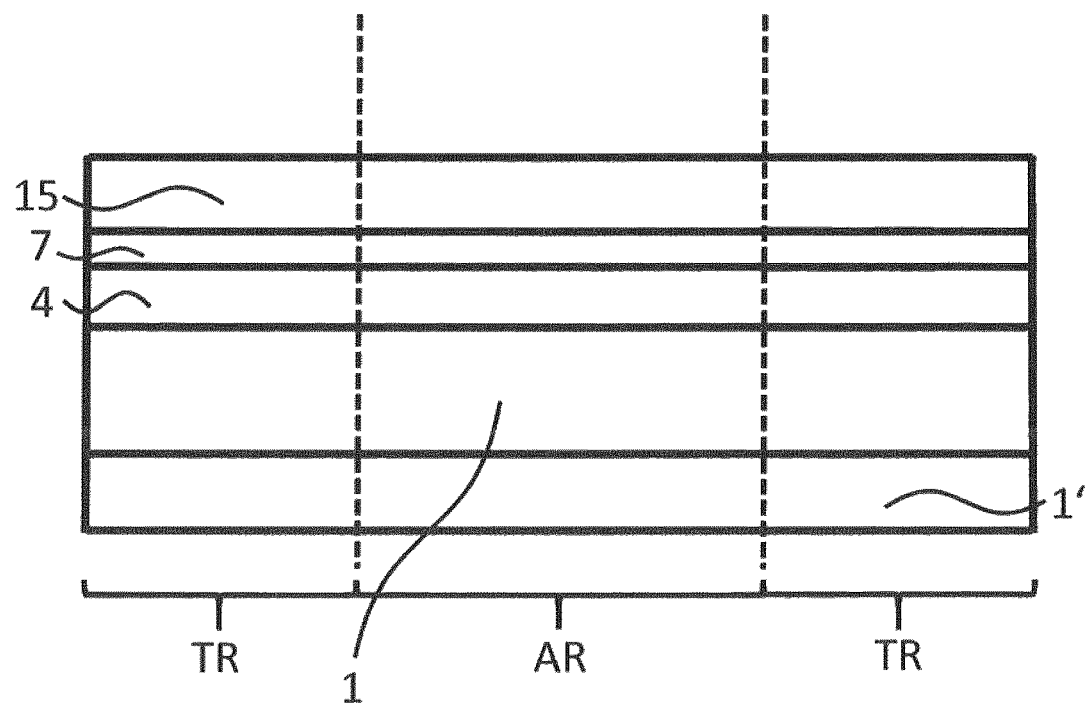
FIGS. 5A to 5H illustrate method steps in a fourth exemplary method for manufacturing a fourth embodiment of a power semiconductor device according to the invention.
Figure 5B:
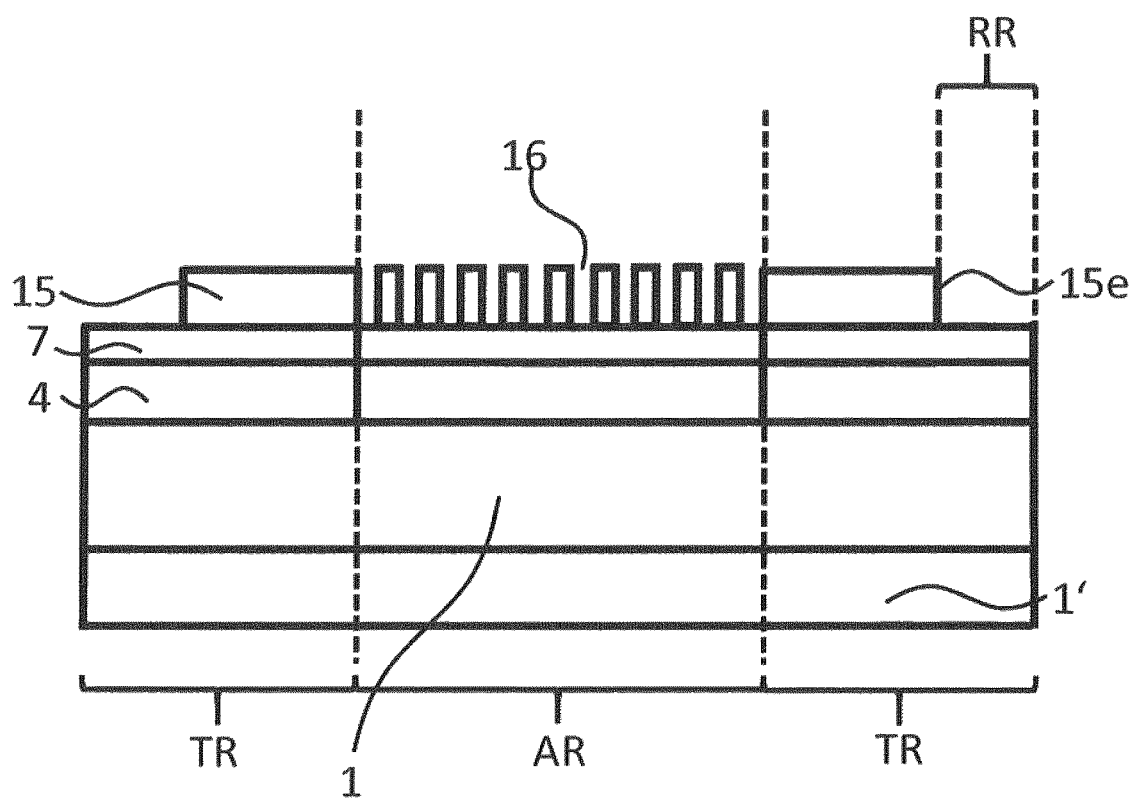
Figure 5C:
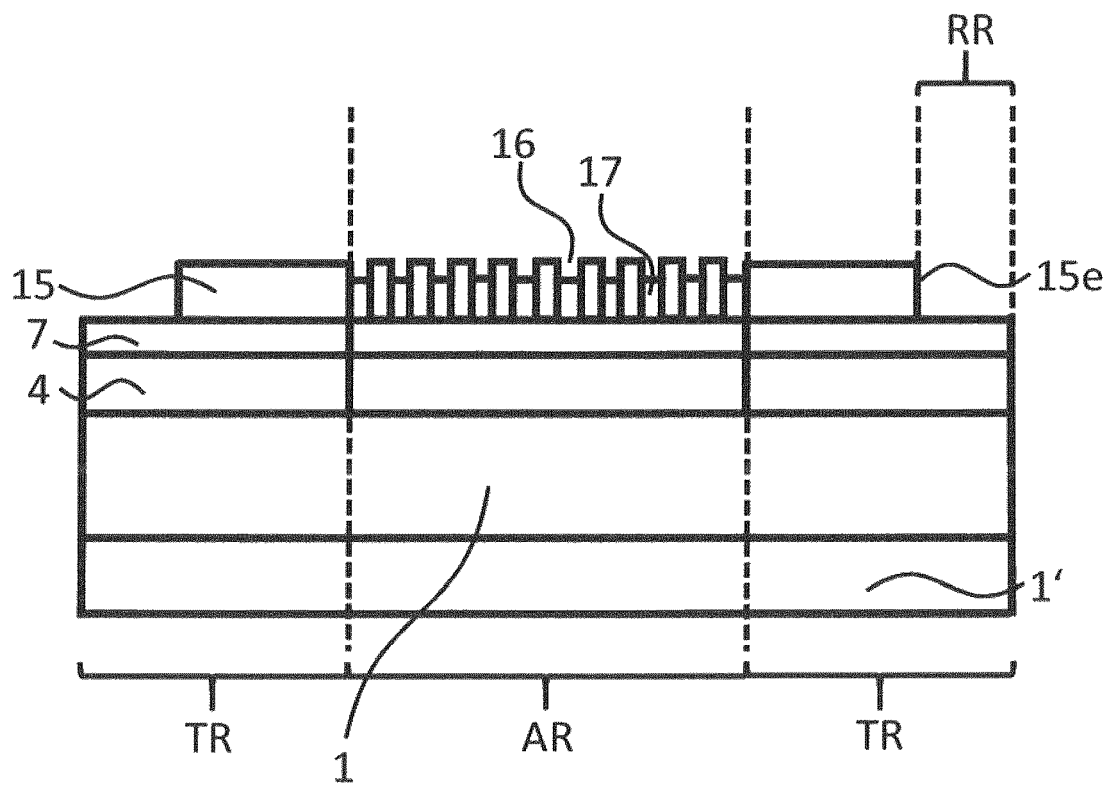
Figure 5D:
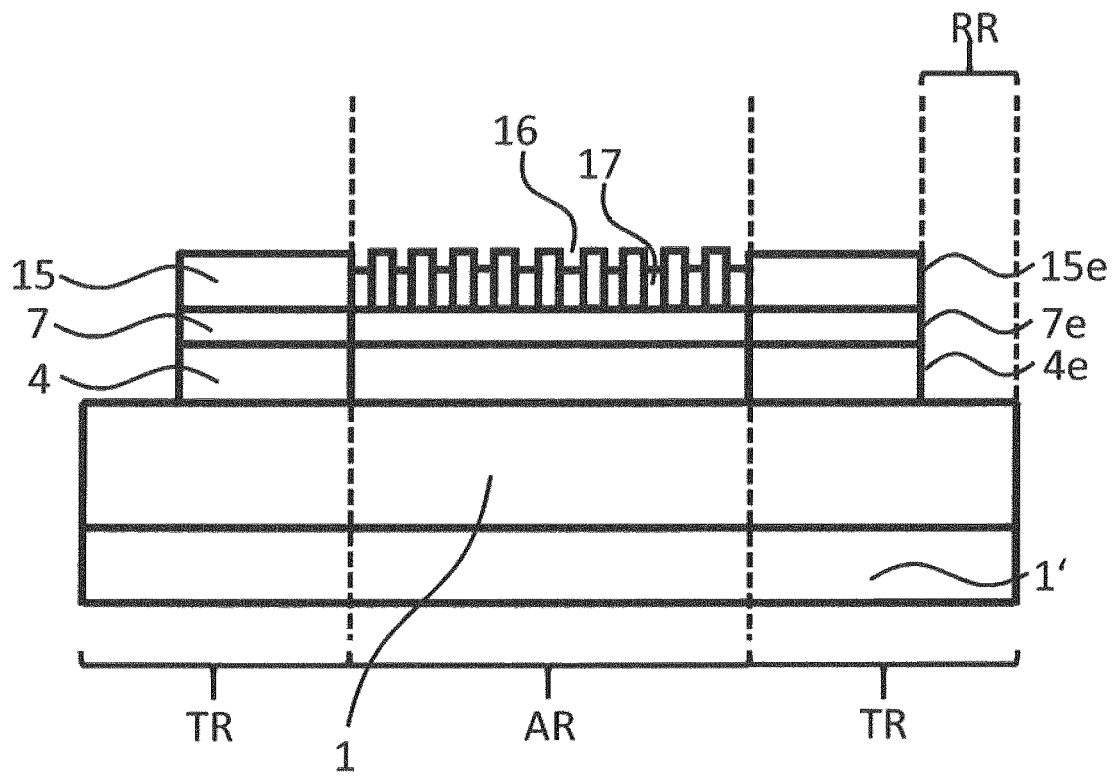
Figure 5E:
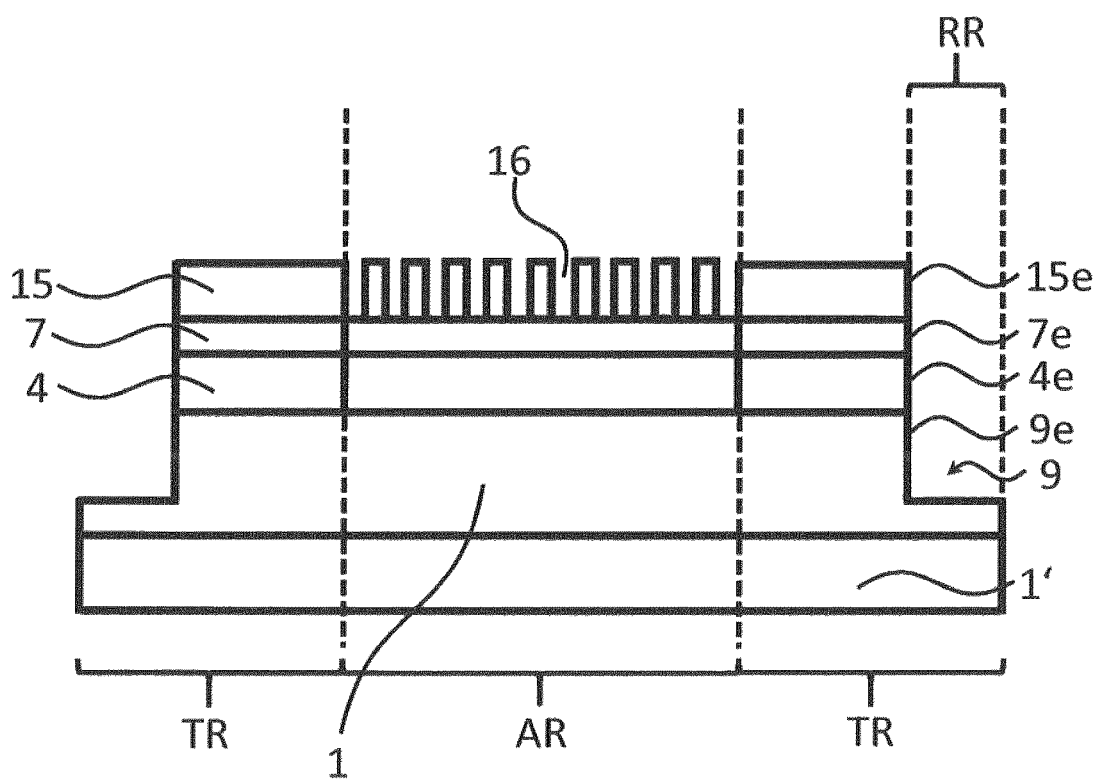
Figure 5F:
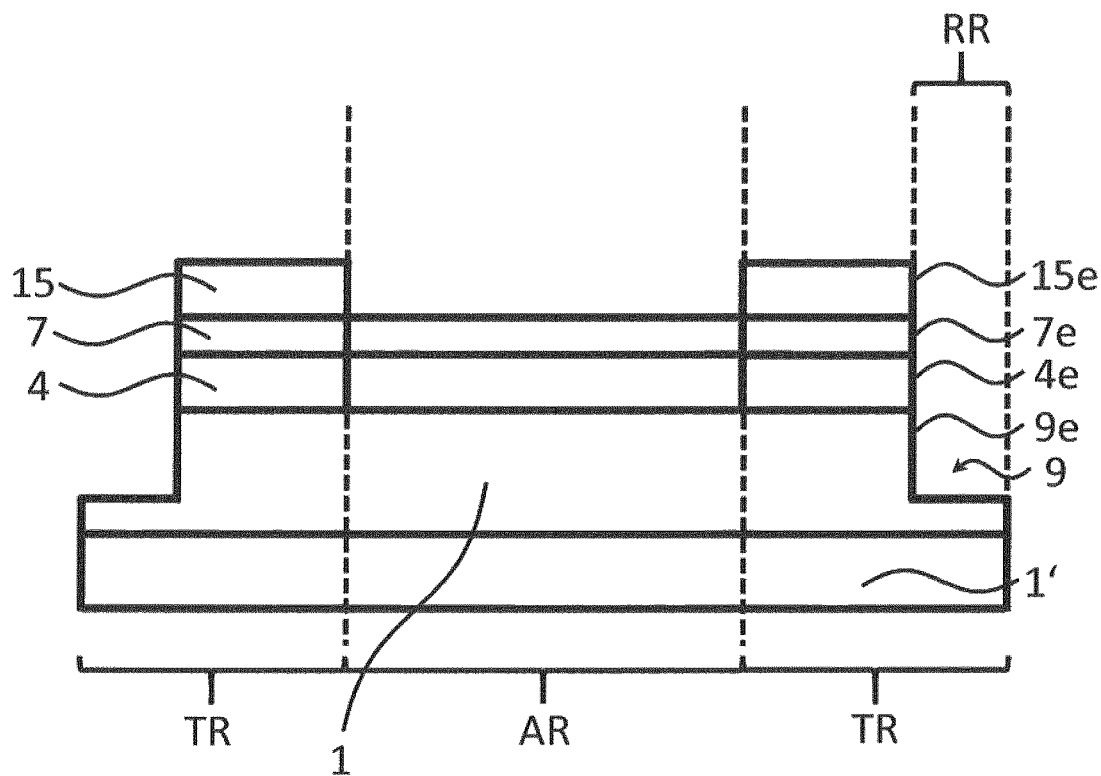
Figure 5G:
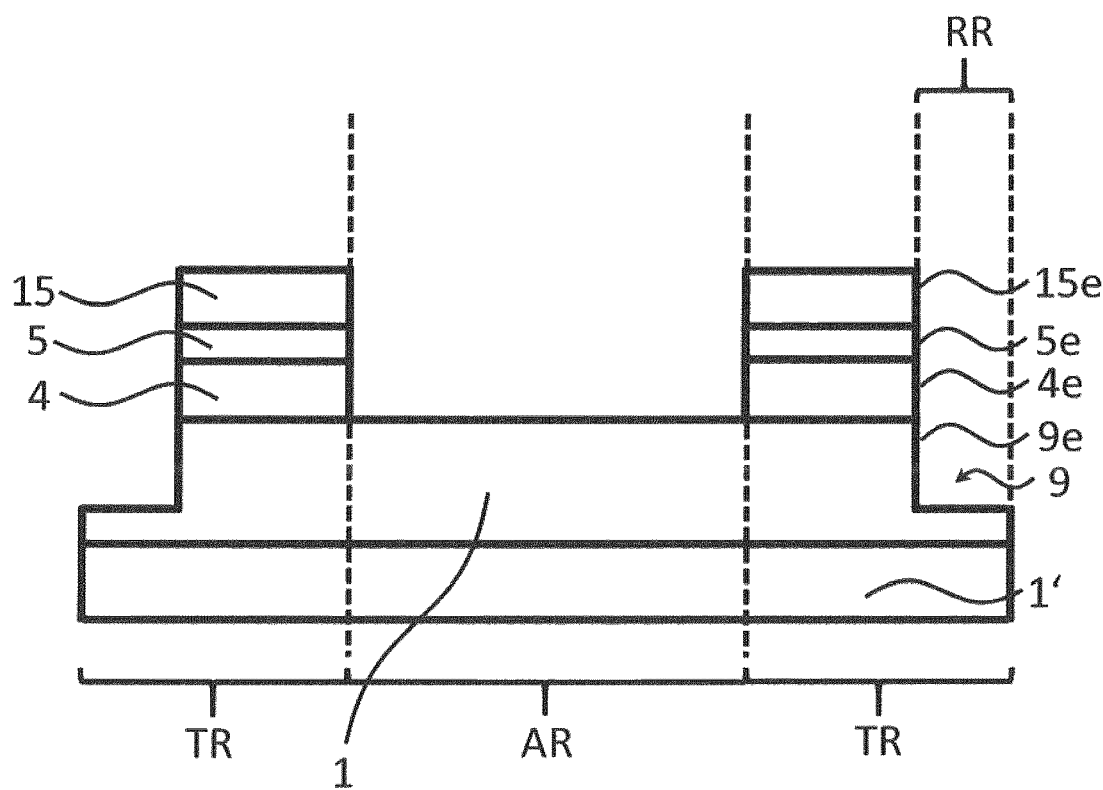
Figure 5H:
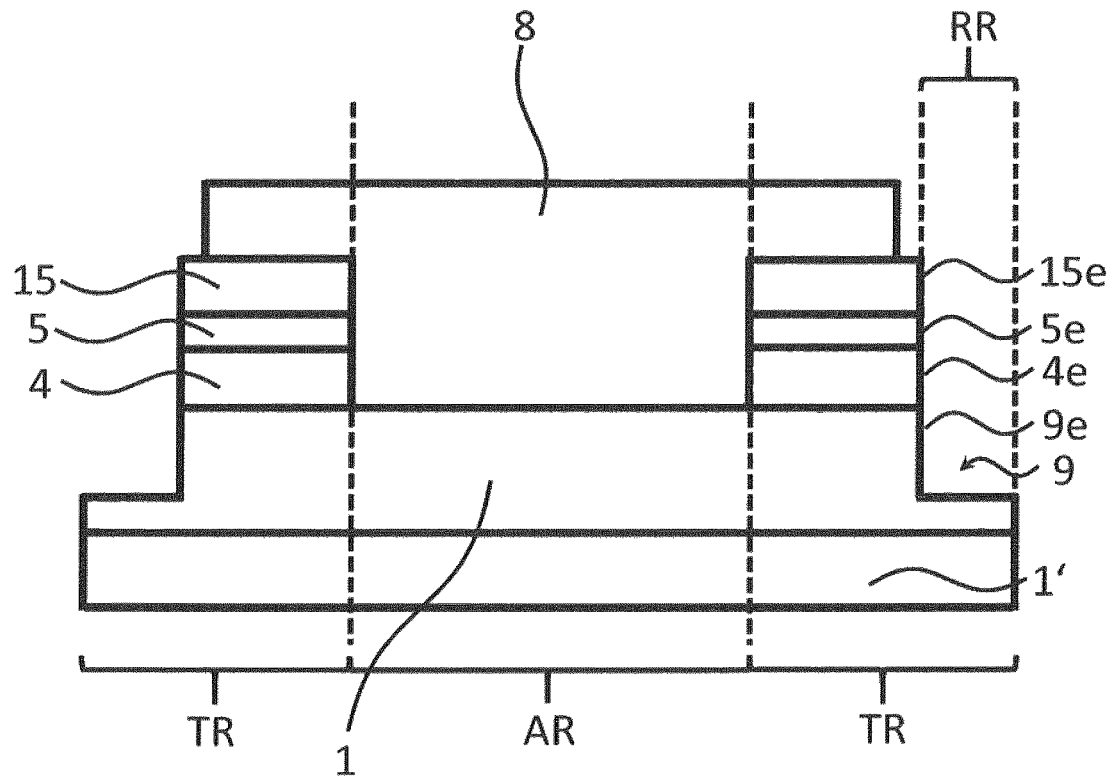

As shown in FIG. 5A, a dielectric layer 4 is formed on the first main side of the silicon carbide layer 1 as described for the first method. Thereon a first metal layer 7 is formed, and a second metal layer 15 is formed on the first metal layer 7. The first 7 and the second 15 metal layer are formed of different metals such that the first metal layer 7 acts as an etch stop when etching the second metal layer 15. The first metal layer 7 and second metal layer 15 may exemplarily comprise one of the field plate materials mentioned above when describing the first embodiment. Preferentially, the first metal layer 7 is more etch resistive against an etchant used for etching the SiC layer 1 than the second metal. The first metal layer 7 may, for example, be thinner than the second metal layer 15. Next, as shown in FIG. 5B, the second metal layer 15 is patterned, for example according to the method described for manufacturing the first embodiment with reference to FIG. 2D, such that trenches 16 are formed in the second metal layer 15 in the active region AR to expose the first metal layer 7 at the bottom of the trenches and such that the first metal layer 7 is exposed in areas coinciding with the first portion of the SiC layer 1 in the termination region TR where the first recess 9 is to be formed. Thereafter, as shown in FIG. 5C, the trenches 16 in the second metal layer 15 are filled at least partially by a filling material 17. For example, the filling material 17 may be an oxide or a resist. Thereafter, as shown in FIG. 5D, the first metal layer 7 and the dielectric layer 4 are patterned by anisotropic etching using the second metal layer 15 and the filling material 17 as an etching mask to expose at least the portion of the first main side 2 of the SiC layer 1 in the termination region TR where the first recess 9 (i.e. the mesa type termination) is to be formed. The sidewalls of the trenches (i.e. the portions of the second metal layer 15 separating neighbouring trenches 16) together with the filling material 17 filled inside the trenches 16 provide sufficient etch resistivity to prevent etching of the first metal layer 7 and the dielectric layer 4 located underneath. Next, as shown in FIG. 5E, the first recess 9 is formed in the termination region of the SiC layer 1 by anisotropic etching using the first metal layer 7 and the second metal layer 15 at least as a part of the etching mask. During this etching process the filling material 16 in the trenches 17 may be consumed, alternatively the filling material 16 may be removed before or after the step of the anisotropic etching of the SiC layer 1. Next, as shown in FIG. 5F, a portion of the second metal layer 15 in which the trenches 16 are formed is removed by isotropic etching of portions respectively separating neighbouring trenches, i.e. the sidewalls. The etchant used in this step is selective against the metal of the first metal layer 7, i.e. the first metal layer 7 is not, or only hardly consumed in this etching step. Thereafter, as shown in FIG. 5G, portions of the first metal layer 7 and of the dielectric layer 4 are removed in the active region AR by anisotropic etching using the second metal layer 15 as an etching mask 17 to expose a portion of the first main side 2 of the silicon carbide layer 1 in the active region AR. In this step an upper portion of the second metal layer 7 may be consumed. However, as explained with respect to the method for manufacturing the first embodiment, because of the anisotropic etching, this will only affect the thickness of the second metal layer 15 and not its lateral dimension. The second metal layer 15 may also be entirely consumed. The remaining portion of the first metal layer 7 and the second metal layer 15 above the dielectric layer 4 form the field plate 5. Thereafter, as shown in FIG. 5H, a contact electrode 8 is formed (e.g. by growing or depositing) in direct contact with a portion (an example of the fourth portion in the claims) of the first main side of the silicon carbide layer 1 in the active region (AR) as explained with the method for manufacturing the first embodiment with reference to FIG. 2F. Finally, a passivation layer 11 and a backside electrode 10 are added (not shown). Alternatively, the passivation layer 11 and/or backside electrode 10 may be formed at an earlier step, as explained before.

In a modification of this method, the step of anisotropic etching of the SiC layer 1 is performed after the step in which the trenches 16 are removed.

Modifications:

It will be apparent for persons skilled in the art that modifications of the above described embodiments are possible without departing from the idea of the invention as defined by the appended claims. In particular, that it is possible to combine features of the different embodiments.

In the above embodiments the manufactured power semiconductor device is a SiC Schottky diode. However, the power semiconductor device may be any other power semiconductor device that requires an edge termination, such as a JBS rectifier, JFET, or a pn diode, for example.

In the above described embodiments, the power semiconductor device comprises a silicon carbide (SiC) layer 1. The SiC layer 1 is an example of the wide-bandgap semiconductor layer 1 in the claims. Alternatively, the wide-bandgap semiconductor layer 1 can comprise other wide-bandgap semiconductor materials known in the art. For example, instead of being a SiC layer 1, the wide-bandgap semiconductor layer 1 may, for example, be a gallium nitride (GaN) layer or a gallium oxide ($Ga_2O_3$) layer. The wide-bandgap semiconductor layer 1 may also be, for example, a zinc oxide (ZnO) layer, a boron nitride layer (BN), an aluminium nitride layer (AlN), or a diamond (C) layer, In the above described embodiments the SiC layer 1 is provided as a layer on a SiC substrate 1'. The SiC substrate 1' may however also be formed out of a different substrate material known in the art. For example, the SiC substrate 1' may be a gallium nitride (GaN) substrate or a gallium oxide ($Ga_2O_3$) substrate. Also, the wide-bandgap semiconductor layer 1 may be provided as a separate layer or wafer without the substrate 1'.

In the figures of all embodiments the angle formed by a sidewall of the recess 9, 14 and the first main side 2 is shown to be 90° but it may also be slightly smaller and also larger. Exemplarily, the angle formed by a sidewall of the recess 9, 14 and the first main side 2 may vary in a range between 60° and 120°, exemplarily between 70° and 110°, more exemplarily between 80° and 100°.

The above embodiments were explained with specific conductivity types. The conductivity types of the semiconductor layers in the above described embodiments might be switched, so that all layers which were described as p-type layers would be n-type layers and all layers which were described as n-type layers would be p-type layers.

It should be noted that the term "comprising" does not exclude other elements or steps and that the indefinite article "a" or "an" does not exclude the plural. Also elements described in association with different embodiments may be combined.

LIST OF REFERENCE SIGNS 1 wide-bandgap semiconductor layer (e.g. SiC layer)
1' substrate (e.g. SiC substrate)
2 first main side
3 second main side
4 dielectric layer
4e circumferential edge of the dielectric layer
5 field plate
5e circumferential edge of the field plate
6 etching mask
7 (first) metal layer
7e circumferential edge of (first) metal layer
8 contact electrode
8' contact portion
9 first recess (mesa-type termination structure)
9e sidewall of the first recess
10 backside electrode
11 passivation layer
12 opening
13 duct
14 trench
15 second metal layer
15e circumferential edge of second metal layer
16 trench
17 filling material
AR active region
RR recess region
TR termination region
$d_R$ depth of recess
$d_{SiC}$ layer thickness of the wide-bandgap semiconductor layer 1 (e.g. the SiC layer 1)
do layer thickness of the dielectric layer 4
$w_R$ lateral dimension of the first recess 9
$w_{FP}$ lateral dimension of the field plate

The invention claimed is:

1. A power semiconductor device comprising:
a wide-bandgap semiconductor layer having a first main side and a second main side opposite to the first main side, wherein the first main side and the second main side extend in a lateral direction and wherein the wide-bandgap semiconductor layer comprises an active region and a termination region that laterally surrounds the active region, wherein the wide-bandgap semiconductor layer has a first recess that is recessed from the first main side in the termination region and surrounds the active region and wherein the wide-bandgap semiconductor layer also has a second recess that is recessed from the first main side in the active region and is filled with an insulating material, a depth of the second recess being the same as a depth of the first recess;

a field plate on the first main side of the wide-bandgap semiconductor layer over a first portion of the termination region, the field plate exposing the active region and a second portion of the wide-bandgap semiconductor layer in the termination region; and a dielectric layer interposed between the field plate and the wide-bandgap semiconductor layer to separate the field plate from the wide-bandgap semiconductor layer;

wherein a sidewall of the first recess adjacent to the active region is laterally aligned with a circumferential edge of the field plate such that in an orthogonal projection onto a plane parallel to the first main side, an edge of the first recess defined by an upper end of the sidewall is within less than 1 nm from the circumferential edge of the field plate.

2. The power semiconductor device according to claim 1, wherein a thickness of the dielectric layer perpendicular to the lateral direction decreases with increasing lateral distance from the first recess.

3. The power semiconductor device according to claim 1, wherein the dielectric layer has a thickness adjacent to the first recess which is in a range between 0.2 μm and 1 μm.

4. The power semiconductor device according to claim 3, wherein the dielectric layer has a thickness adjacent to the first recess which is in a range between 0.2 μm and 0.5 μm.

5. The power semiconductor device according to claim 4, wherein the dielectric layer has a thickness adjacent to the first recess which is in a range between 0.2 μm and 0.3 μm.

6. A method for manufacturing the power semiconductor device of claim 1, the method comprising:
   forming the dielectric layer on the first main side of the wide-bandgap semiconductor layer;
   forming a first metal layer on the dielectric layer;
   forming the field plate by patterning the first metal layer and the dielectric layer to expose the portion of the first main side of the wide-bandgap semiconductor layer in the termination region; and
   anisotropically etching the wide-bandgap semiconductor layer using the patterned first metal layer as at least part of an etching mask in areas where the field plate exposes the first portion of the first main side of the wide-bandgap semiconductor layer in the termination region to form the first recess in the wide-bandgap semiconductor layer in the termination region.

7. The method according to claim 6, wherein:
   the patterned first metal layer and the patterned dielectric layer expose the active region;
   wherein the anisotropically etching further forms the second recess in the active region; and
   wherein the method further comprises filling the second recess with a filling material.

8. The method according to claim 6, further comprising patterning the dielectric layer before forming the first metal layer so as to form an opening in the dielectric layer that exposes at least a second portion of the first main side of the wide-bandgap semiconductor layer in the active region.

9. The method according to claim 8, wherein:
   the patterned first metal layer and the patterned dielectric layer expose a fourth portion of the first main side of the wide-bandgap semiconductor layer in the active region;

the method further comprises forming a contact electrode in direct contact with the fourth portion of the first main side of the wide-bandgap semiconductor layer before the anisotropic etching; and the contact electrode is used together with the patterned first metal layer as the etching mask while anisotropic etching of the wide-bandgap semiconductor layer.

10. The method according to claim 8, wherein the first metal layer is formed to be in direct contact with the first main side of the wide-bandgap semiconductor layer through the opening in the dielectric layer.

11. The method according to claim 8, wherein forming the field plate comprises:
    forming a second metal layer on the first metal layer, wherein the first and the second metal layer are formed of different metals; and
    patterning the second metal layer to expose at least the first portion of the first main side of the wide-bandgap semiconductor layer in the termination region where the first recess is to be formed in the step of the anisotropic etching; and
    wherein the second metal layer is used at least as a part of the etching mask during the anisotropic etching.

12. The method according to claim 11, wherein patterning the second metal layer, the first metal layer and the dielectric layer comprises:
    patterning the second metal layer to expose the first metal layer in areas of the first portion of the first main side of the wide-bandgap semiconductor layer in the termination region;
    forming trenches in the second metal layer in the active region to expose the first metal layer at the bottom of the trenches;
    refilling the trenches at least partially by a filling material; and
    patterning the first metal layer and the dielectric layer by anisotropic etching using the second metal layer and the filling material as an etching mask.

13. The method according to claim 12, further comprising:
    removing the filling material after patterning the first metal layer and the dielectric layer;
    thereafter removing a portion of the second metal layer in which the trenches are formed by isotropic etching of portions respectively separating neighboring trenches;
    thereafter removing portions of the first metal layer and of the dielectric layer in the active region by anisotropic etching using the second metal layer as an etching mask to expose a fifth portion of the first main side of the wide-bandgap semiconductor layer in the active region; and
    forming a contact electrode contacting the fifth portion of the first main side of the wide-bandgap semiconductor layer.

14. A power semiconductor device comprising:
    a wide-bandgap semiconductor layer having a first main side and a second main side opposite to the first main side, wherein the first main side and the second main side extend in a lateral direction and wherein the wide-bandgap semiconductor layer comprises an active region and a termination region that laterally surrounds the active region;
    a field plate on the first main side of the wide-bandgap semiconductor layer overlying a first portion of the termination region, the field plate exposing the active region and a second portion of the termination region, the second portion of the termination region spaced from the active region by the first portion of the termination region;

a first recess that is recessed from the first main side in the termination region and surrounds the active region, wherein a sidewall of the first recess adjacent to the active region is laterally aligned with a circumferential edge of the field plate such that in an orthogonal projection onto a plane parallel to the first main side an edge of the first recess defined by an upper end of the sidewall is within less than 1 nm from the circumferential edge of the field plate;

a plurality of second recesses that are recessed from the first main side in the active region and are filled with an insulating material, a depth of the plurality of second recesses being the same as a depth of the first recess;

a dielectric layer interposed between the field plate and the wide-bandgap semiconductor layer to separate the field plate from the wide-bandgap semiconductor layer;

a first electrode disposed at first main side and overlying the active region and the plurality of second recesses; and a second electrode disposed at the second main side.

15. The power semiconductor device according to claim 14, wherein a thickness of the dielectric layer perpendicular to the lateral direction decreases with increasing lateral distance from the first recess.

* * * * *

UNITED STATES PATENT AND TRADEMARK OFFICE
CERTIFICATE OF CORRECTION

| | | |
|---|---|---|
| PATENT NO. | : 11,888,037 B2 | Page 1 of 1 |
| APPLICATION NO. | : 16/978560 | |
| DATED | : January 30, 2024 | |
| INVENTOR(S) | : Mihaila et al. | |

It is certified that error appears in the above-identified patent and that said Letters Patent is hereby corrected as shown below:

On the Title Page

Item (71), in Column 1, in "Applicant", Line 1, delete "Zurich" and insert -- Zürich --.

Item (73), in Column 1, in "Assignee", Line 1, delete "Zurich" and insert -- Zürich --.

In the Claims

In Column 17, in Claim 1, Line 20, delete "1 nm" and insert -- 1 µm --.

In Column 19, in Claim 14, Line 11, delete "1 nm" and insert -- 1 µm --.

Signed and Sealed this
Thirtieth Day of April, 2024

Katherine Kelly Vidal
*Director of the United States Patent and Trademark Office*